(12) United States Patent
Masuoka et al.

(10) Patent No.: US 8,053,842 B2
(45) Date of Patent: Nov. 8, 2011

(54) SEMICONDUCTOR STORAGE DEVICE

(75) Inventors: Fujio Masuoka, Tokyo (JP); Shintaro Arai, Tokyo (JP)

(73) Assignee: Unisantis Electronics (Japan) Ltd., Tokyo (JP)

( * ) Notice: Subject to any disclaimer, the term of this patent is extended or adjusted under 35 U.S.C. 154(b) by 142 days.

(21) Appl. No.: 12/699,634

(22) Filed: Feb. 3, 2010

(65) Prior Publication Data
US 2010/0219482 A1  Sep. 2, 2010

Related U.S. Application Data

(63) Continuation of application No. PCT/JP2009/051461, filed on Jan. 29, 2009.

(60) Provisional application No. 61/207,621, filed on Feb. 13, 2009.

(30) Foreign Application Priority Data

Jan. 29, 2008  (WO) .................. PCT/JP2008/051302

(51) Int. Cl.
*H01L 21/70* (2006.01)
(52) U.S. Cl. ................................. 257/369; 257/E29.255
(58) Field of Classification Search .................. 257/369, 257/E29.255
See application file for complete search history.

(56) References Cited

U.S. PATENT DOCUMENTS

| | | | |
|---|---|---|---|
| 5,382,816 A | 1/1995 | Mitsui | |
| 5,480,838 A | 1/1996 | Mitsui | |
| 5,994,735 A | 11/1999 | Maeda et al. | |
| 6,127,209 A | 10/2000 | Maeda et al. | |
| 6,175,138 B1 | 1/2001 | Noda | |
| 6,461,900 B1 | 10/2002 | Sundaresan et al. | |
| 2002/0195652 A1 | 12/2002 | Maeda et al. | |
| 2004/0005755 A1 | 1/2004 | Moniwa et al. | |
| 2004/0113207 A1 | 6/2004 | Hsu et al. | |
| 2007/0007601 A1 | 1/2007 | Hsu et al. | |
| 2007/0173006 A1 | 7/2007 | Moniwa et al. | |

FOREIGN PATENT DOCUMENTS

JP  02-188966 A  7/1990
(Continued)

OTHER PUBLICATIONS

Written Opinion of the International Searching Authority for International Application No. PCT/JP2008/051302, dated Apr. 8, 2008, 5 pages.

(Continued)

*Primary Examiner* — Thanh V Pham
*Assistant Examiner* — Marvin Payen
(74) *Attorney, Agent, or Firm* — Brinks Hofer Gilson & Lione

(57) ABSTRACT

It is intended to achieve a sufficiently-small SRAM cell area and a stable operation margin in a Loadless 4T-SRAM comprising a vertical transistor SGT. In a static type memory cell made up using four MOS transistors, each of the MOS transistor constituting the memory cell is formed on a planar silicon layer formed on a buried oxide film, to have a structure where a drain, a gate and a source are arranged in a vertical direction, wherein the gate is formed to surround a pillar-shaped semiconductor layer. The planar silicon layer comprises a first active region having a first conductive type, and a second active region having a second conductive type. The first and second active regions are connected to each other through a silicide layer formed in a surface of the planar silicon layer to achieve an SRAM cell having a sufficiently-small area.

8 Claims, 25 Drawing Sheets

FOREIGN PATENT DOCUMENTS

| | | |
|---|---|---|
| JP | 04-234166 A | 8/1992 |
| JP | 06-021467 A | 1/1994 |
| JP | 06-237003 A | 8/1994 |
| JP | 07-099311 A | 4/1995 |
| JP | 10-079482 A | 3/1998 |
| JP | 2000-012705 A | 1/2000 |
| JP | 2004-096065 A | 3/2004 |
| JP | 2004-193588 A | 7/2004 |
| JP | 2005-135451 A | 5/2005 |
| JP | 2008-205168 A | 9/2008 |

OTHER PUBLICATIONS

Written Opinion of the International Searching Authority for International Application No. PCT/JP2009/051461, dated Apr. 21, 2009, 6 pages.
European Search Report for counterpart European Application No. 09705485.2, dated Feb. 14, 2011, 5 pages.
International Search Report for International Application No. PCT/JP2008/051302, dated Apr. 8, 2008, 2 pages.
International Search Report for International Application No. PCT/JP2009/051461, dated Apr. 21, 2009, 2 pages.

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

SEMICONDUCTOR STORAGE DEVICE

RELATED APPLICATIONS

Pursuant to 35 U.S.C. §119(e), this application claims the benefit of the filing date of Provisional U.S. Patent Application Ser. No. 61/207,621 filed on Feb. 13, 2009. This application is a continuation application of PCT/JP2009/051461 filed on Jan. 29, 2009 which claims priority under 35 U.S.C. §365(a) to PCT/JP2008/051302 filed on Jan. 29, 2008. The entire contents of these applications are hereby incorporated by reference.

TECHNICAL FIELD

The present invention relates to a semiconductor storage device, and more particularly to a semiconductor storage device comprising an SRAM (Static Random Access Memory).

BACKGROUND ART

With a view to achieving higher integration and higher performance of a semiconductor device, an SGT (Surrounding Gate Transistor) has been proposed which is a vertical transistor comprising a pillar-shaped semiconductor layer formed on a surface of a semiconductor substrate, and a gate formed to surround a sidewall of the pillar-shaped semiconductor layer (as disclosed, for example, in Patent Document 1: JP 2-188966A). In the SGT, a source, a gate and a drain are arranged in a vertical direction, so that an occupancy area can be significantly reduced as compared with a conventional planar transistor.

In cases where an LSI (large-scale integration) circuit is made up using an SGT, it is essential to employ an SRAM comprising a combination of a plurality of SGTs, as a cache memory for the LSI circuit. In recent years, there is an extremely strong need for increasing a capacity of an SRAM to be mounted on an LSI circuit. Thus, in the SGT-based LSI circuit, it is also essential to achieve an SRAM having a sufficiently-small cell area.

FIG. 24($a$) and FIG. 24($b$) are, respectively, a top plan view and a sectional view of a CMOS 6T-SRAM disclosed as one embodiment in Patent Document 2 (JP 7-99311A), wherein an SRAM cell comprises six transistors each designed using an SGT. With reference to FIGS. 24($a$) and 24($b$), a structure of the SRAM cell will be described below. A bit line, a ground line GND, and a power supply potential line Vcc, are formed by an N$^+$ diffusion layer (601$a$, 601$b$), an N$^+$ diffusion layer 602, and a P$^+$ diffusion layer 603. Six pillar-shaped silicon layers are formed on the diffusion layers to constitute two access transistors 610$a$, 610$b$ each operable to allow access to a memory cell, two driver transistors 611$a$, 611$b$ each operable to drive the memory cell, and two load transistors 612$a$, 612$b$ each operable to supply electric charges to the memory cell. Further, a gate (604$a$, 604$b$, 604$c$, 604$d$) is formed to surround each of the pillar-shaped silicon layers. A storage node is made up of an interconnection layer (607$a$, 607$b$). In each of the transistors constituting the SRAM cell, a source, a gate and a drain are vertically formed on and along the pillar-shaped silicon layer, so that the SRAM cell can be designed to have a sufficiently-small cell area.

Patent Document 1: JP 2-188966A
Patent Document 2: JP 7-99311A (paragraph [0051], FIG. 75)
Patent Document 3: JP 2000-12705A In reality, the above SRAM cell involves the following problem. In the SRAM discloses in the Parent Document 2, each of the power supply potential line 603 and the ground line 602 in an SRAM cell array can be formed at a level of minimum size so as to achieve a sufficiently-small cell area. However, the power supply potential line 603 and the ground line 602 are formed by the P$^+$ diffusion layer and the N$^+$ diffusion layer, respectively. Thus, if each of the power supply potential line 603 and the ground line 602 is formed at a level of minimum size, a resistance thereof will be extremely increased, which makes it impossible to ensure a stable operation of the SRAM. Conversely, if the size of each of the power supply potential line 603 and the ground line 602 is increased so as to allow the SRAM to stably operate, the SRAM cell area will be increased.

As an SRAM capable of achieving a greater reduction in SRAM cell area than the CMOS 6T-SRAM, a Loadless 4T-SRAM (the Patent Document 3: JP 2000-12705A) has been proposed. FIG. 1 shows an equivalent circuit of a Loadless 4T-SRAM cell. The Loadless 4T-SRAM cell comprises total four transistors consisting of two PMOS access transistors each operable to access to the memory cell, and two NMOS driver transistors each operable to the memory cell.

As one example of an operation of the memory cell in FIG. 1, a data holding operation under a condition that data "L" is stored in a storage node Qa1, and data "H" is stored in a storage node Qb1, will be described below. During the data holding operation, each of a word line WL1 and two bit lines BL1, BLB1 is driven to an "H" potential. A threshold voltage of the access transistor (Qp11, Qp21) is set to be less than that of the driver transistor (Qn11, Qn21), and an OFF-leak current of the access transistor is set to be greater (e.g., on average, about 10 to 1000 times greater) than a leak current of the driver transistor. Thus, an OFF-leak current flows from the bit line BLB1 to the storage node Qb1 through the access transistor Qp21, so that the "H" level in the storage node Qb1 is held. Meanwhile, the "L" level in the storage node Qa1 is stably held by the driver transistor Qn11.

Even in SGT-based SRAMs, the Loadless 4T-SRAM can achieve a smaller SRAM cell area as compared with the CMOS 6T-SRAM.

In view of the above circumstances, it is an object of the present invention to provide an SGT-based Loadless 4T-SRAM capable of achieving a sufficiently-small SRAM cell area, while ensuring a sufficient operation margin thereof.

SUMMARY OF THE INVENTION

In order to achieve the above object, the present invention provides a semiconductor storage device comprising a static type memory cell in which four MOS transistors are arrayed on a dielectric film formed on a substrate. In the semiconductor storage device, each of the four MOS transistors comprises a source diffusion layer, a drain diffusion layer, a pillar-shaped semiconductor layer disposed between the source and drain diffusion layers, and a gate formed along a sidewall of the pillar-shaped semiconductor layer, wherein the source diffusion layer, the drain diffusion layer and the pillar-shaped semiconductor layer are arranged on the dielectric film formed on the substrate, hierarchically in a vertical direction, and wherein the four MOS transistors function as respective ones of first and second PMOS access transistors each operable to supply electric charges to hold data in the memory cell, and allow access to the memory cell, and first and second NMOS driver transistors each operable to drive a storage node to write and read data in the memory cell. The first PMOS access transistor and the first NMOS driver transistor are arrayed in adjacent relation to each other, and the second PMOS access transistor and the second NMOS driver transistor are arrayed in adjacent relation to each other. The source or drain diffusion layers of the first PMOS access transistor and the first NMOS driver transistor are arranged on the dielectric film as two first diffusion layers to serve as a first storage node for holding data therein, wherein the first diffusion layers are connected to each other through a first silicide layer formed on respective surfaces of the first diffusion layers. Further, the source or drain diffusion layers of the second PMOS access transistor and the second NMOS driver transistor are arranged on the dielectric film as two second diffusion layers to serve as a second storage node for holding data therein, wherein the second diffusion layers are connected to each other through a second silicide layer formed on respective surfaces of the second diffusion layers.

Preferably, in the semiconductor storage device of the present invention, a contact to be formed on a gate line extending from a gate electrode of at least one of the first and second PMOS access transistors is shared as a contact to be formed on a gate line extending from a gate electrode of a PMOS access transistor in an adjacent memory cell.

Preferably, in the semiconductor storage device of the present invention, the pillar-shaped semiconductor layers are arrayed in a hexagonal lattice pattern.

Preferably, in the semiconductor storage device of the present invention, a gate line extending from the gate of the driver transistor formed on one of the first diffusion layers serving as the first storage node is connected to one of the second diffusion layers serving as the second storage node, through a common contact, and a gate line extending from the gate of the driver transistor formed on one of the second diffusion layers serving as the second storage node is connected to one of the first diffusion layers serving as the first storage node, through a common contact.

Preferably, in the semiconductor storage device of the present invention, a peripheral length of the sidewall in each of the pillar-shaped semiconductor layers forming the access transistors and the pillar-shaped semiconductor layers forming the driver transistors, is determined based on an operation margin during reading and an operation margin during writing.

In the semiconductor storage device of the present invention, the four MOS transistors may be arranged on the dielectric film in a two-row by two-column array, wherein: the first PMOS access transistor is arranged at an intersection of the 1st row and the 1st column; the first NMOS driver transistor is arranged at an intersection of the 2nd row and the 1st column; the second PMOS access transistor is arranged at an intersection of the 1st row and the 2nd column; and the second NMOS driver transistor is arranged at an intersection of the 2nd row and the 2nd column.

Alternatively, the four MOS transistors may be arranged on the dielectric film in a two-row by two-column array, wherein: the first PMOS access transistor is arranged at an intersection of the 1st row and the 1st column; the first NMOS driver transistor is arranged at an intersection of the 2nd row and the 1st column; the second PMOS access transistor is arranged at an intersection of the 2nd row and the 2nd column; and the second NMOS driver transistor is arranged at an intersection of the 1st row and the 2nd column.

DETAILED DESCRIPTION OF THE PREFERRED EMBODIMENTS

First Embodiment

Figure 1:
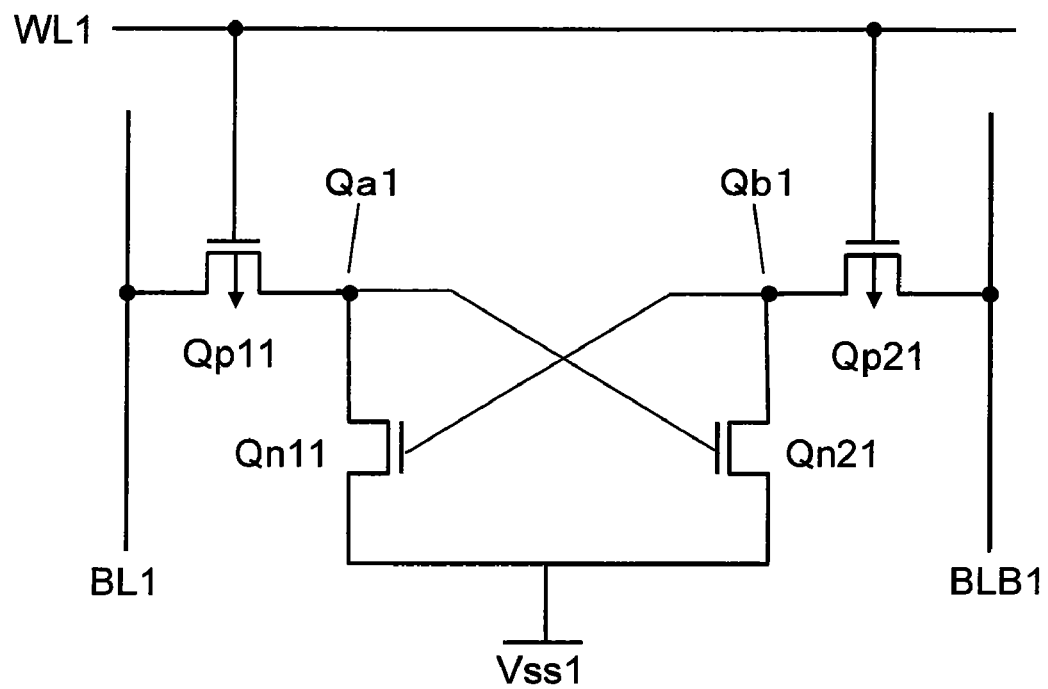
FIG. 1 illustrates an equivalent circuit of a memory cell of an SRAM of the present invention.

FIG. 1 illustrates an equivalent circuit of a memory cell in a Loadless 4T-SRAM of the present invention. In FIG. 1, each of BL1 and BLB1 indicates a bit line, and WL1 indicates a word line. Vcc1 indicates a power supply potential, and Vss1 indicates a ground potential. Each of Qp11 and Qp21 indicates an access transistor having a function of allowing access to the memory cell and charging a storage node to an "H" level, and each of Qn11 and Qn21 indicates a driver transistor for reading and writing data from/to the memory cell. Each of Qa1 and Qb1 indicates a storage node for storing data.

Figure 2:
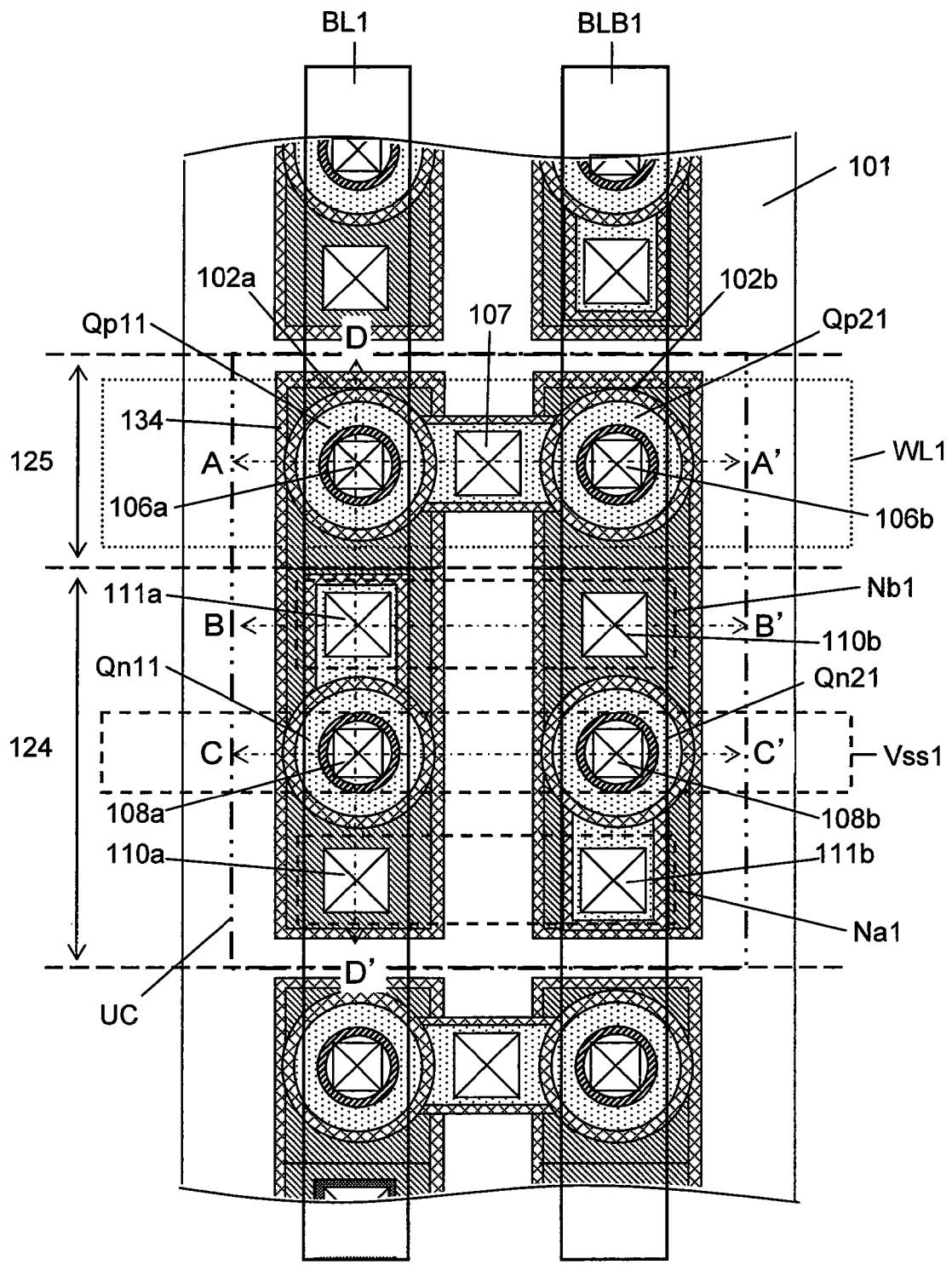
FIG. 2 is a top plan view showing a memory cell of an SRAM according to a first embodiment.

FIG. 2 illustrates a layout of a memory cell in a Loadless 4T-SRAM according to a first embodiment of the present invention. In an SRAM cell array, a unit cell illustrated in FIG. 2 is iteratively arranged. FIGS. 3(a) to 3(d) are sectional views taken along the lines A-A', B-B', C-C' and D-D' in FIG. 2, respectively.

With reference to FIGS. 2 and 3(a) to 3(d), the layout of the memory cell in the SRAM according to the first embodiment will be described below.

A planar silicon layer (102a, 102b) is formed on a dielectric film, such as a buried oxide film layer 101, formed on a substrate. The planar silicon layer (102a, 102b) is formed as an N$^+$ diffusion layer (104a, 104b) and a P$^+$ diffusion layer (103a, 103b), through impurity implantation or the like, wherein the N$^+$ and P$^+$ diffusion layers formed in the same planar silicon layer are connected to each other through a silicide layer (113a, 113b) formed in a surface of the planar silicon layer (102a, 102b). The planar silicon layers 102a, 102b serve as the storage nodes Qa1, Qb1 in FIG. 1, respectively. In FIGS. 2 and 3(a) to 3(d), each of Qn11 and Qn21 indicates an PMOS access transistor operable to allow access to the memory cell, and each of Qn11 and Qn21 indicates an NMOS driver transistor operable to drive the memory cell.

In the first embodiment, one unit cell UC comprises four transistors arranged on the buried oxide film layer 101 in a two-row by two-column array. In the 1st column, the access transistor Qp11 and the driver transistor Qn11 are arranged on the planar silicon layer 102a or a first storage node, in a downward direction in FIG. 2. In the 2nd column, the access transistor Qp21 and the driver transistor Qn21 are arranged on the planar silicon layer 102b or a second storage node, in the downward direction in FIG. 2. The SRAM cell array in the first embodiment is formed by continuously arranging a plurality of the unit cells UC each comprising the four transistors, in an upward-downward direction in FIG. 2.

A contact 110a formed on the planar silicon layer 102a is connected to a contact 111b formed on a gate line extending from a gate electrode of the driver transistor Qn21, through a node interconnection line Na1. A contact 110b formed on the planar silicon layer 102b is connected to a contact 111a formed on a gate line extending from a gate electrode of the driver transistor Qn11, through a node interconnection line Nb1. A contact 106a formed on a top of the access transistor Qp11 is connected to a bit line BL1, and a contact 106b formed on a top of the access transistor Qp21 is connected to a bit line BLB1. A common contact 107 formed on a gate line extending from respective gate electrodes of the access transistor Qp11 and the access transistor Qp21 is connected to a word line WL1. A contact (108a, 108b) formed on a top of the driver transistor (Qn11, Qn21) is connected to an interconnection layer Vss1 having a ground potential.

Preferably, in order to share each of the word line, the bit line and the ground potential line, with other memory cells, such a line is connected to each of the memory cells through a higher-level layer than a node interconnection line to be wired in each of the memory cells. As one example of the hierarchical wiring configuration, it is contemplated that the node interconnection line (Na1, Nb1) and the ground potential line Vss1 are wired in a lower-level layer than the bit line (BL1, BLB1), and the word line WL1 is wired in a higher-level layer than the bit line (BL1, BLB1), to keep each line from coming in contact with an unintended one of the contacts.

An N$^+$ implantation zone 124 and a P$^+$ implantation zone 125 are illustrated in FIG. 2. In the first embodiment, a pattern for defining the N$^+$ implantation zone 124 and the P$^+$ implantation zone 125 in an SRAM cell array region is formed by simple lines and spaces. This makes it possible to reduce an impact of dimension error and alignment error to minimize a dimensional margin around a boundary between the N$^+$ implantation zone and the P$^+$ implantation zone. Specifically, in FIG. 2, a length of the SRAM cell in a longitudinal direction thereof (in a connection direction of the SRAM cells) can be effectively reduced.

In the first embodiment, the storage nodes and the gate lines are formed only in a rectangular shape. This makes it possible to easily correct a pattern shape by OPC (Optical Proximity Correction), and provide a layout suitable for achieving a sufficiently-small SRAM cell area.

In the first embodiment, a source and a drain in each of the transistors constituting the SRAM are defined as follows. In regard to the driver transistor (Qn11, Qn21), a diffusion layer formed in an upper portion of a pillar-shaped semiconductor layer and connected to the ground potential is defined as a source diffusion layer, and a diffusion layer formed underneath the pillar-shaped semiconductor layer is defined as a drain diffusion layer. In regard to the access transistor (Qp11, Qp21), although each of a diffusion layer formed in an upper portion of a pillar-shaped semiconductor layer and a diffusion layer formed underneath the pillar-shaped semiconductor layer serves as a source or a drain depending on an operating state, the diffusion layer formed in the upper portion of the pillar-shaped semiconductor layer and the diffusion layer formed underneath the pillar-shaped semiconductor layer are defined, respectively, as a source diffusion layer and a drain diffusion layer, for descriptive purposes.

Figure 3A:
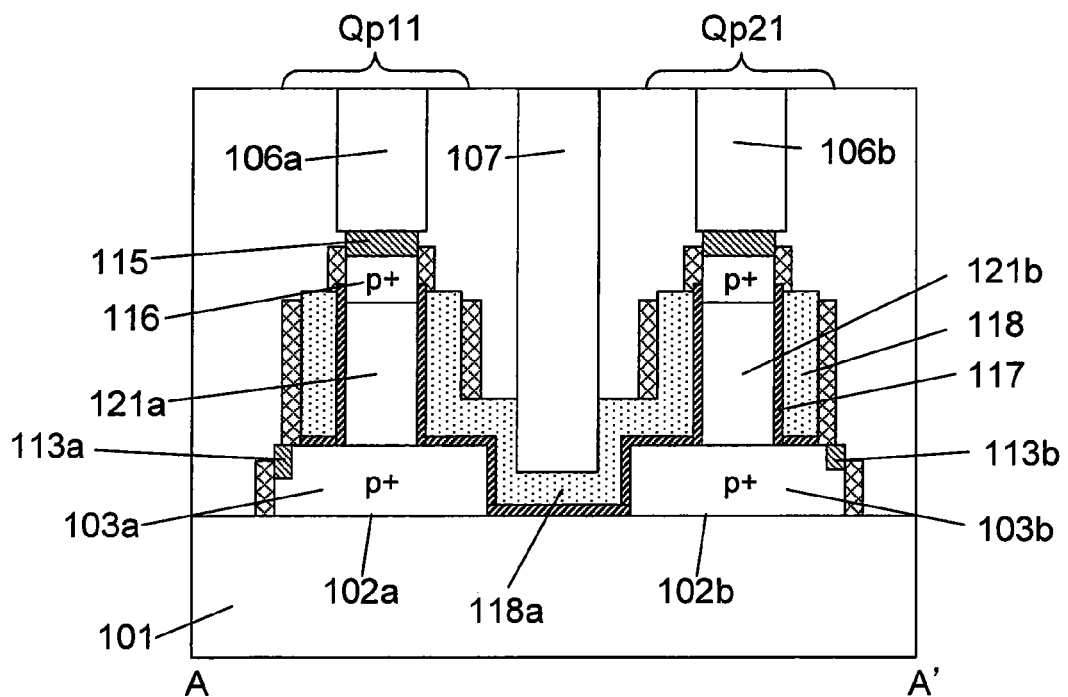
FIG. 3(a) is a sectional view showing the memory cell of the SRAM according to the first embodiment.

With reference to the section views of FIGS. 3(a) to 3(d), a structure of the SRAM according to the first embodiment will be described below. As shown in FIG. 3(a), a planar silicon layer (102a, 102b) serving as a storage node is formed on a buried oxide film layer 101, and a P$^+$ drain diffusion layer (103a, 103b) is formed in the planar silicon layer (102a, 102b) by impurity implantation or the like. An element isolation region for isolating between the planar silicon layers 102a, 102b can be formed simply by dividing a continuous planar silicon layer into two pieces by etching. Thus, the element isolation region can be formed in a minimum fabrication size through a process having a less number of steps. A silicide layer (113a, 113b) is formed in a surface of the P+ drain diffusion layer (103a, 103b). A pillar-shaped silicon layer 121a constituting an access transistor Qp11 is formed on the P+ drain diffusion layer 103a, and a pillar-shaped silicon layer 121b constituting an access transistor Qp21 is formed on the P+ drain diffusion layer 103b. A gate dielectric film 117 and a gate electrode 118 are formed around each of the pillar-shaped silicon layers. A P+ source diffusion layer 116 is formed in an upper portion of the pillar-shaped silicon layer (121a, 121b) by impurity implantation or the like, and a silicide layer 115 is formed in a surface of the source diffusion layer. A contact 106a formed on the access transistor Qp11 is connected to a bit line BL1, and a contact 106b formed on the access transistor Qp21 is connected to a bit line BLB1. A contact 107 formed on a gate line 118a extending from the respective gate electrodes of the access transistors Qp11, Qp21 is connected to a word line WL1.

Figure 3B:
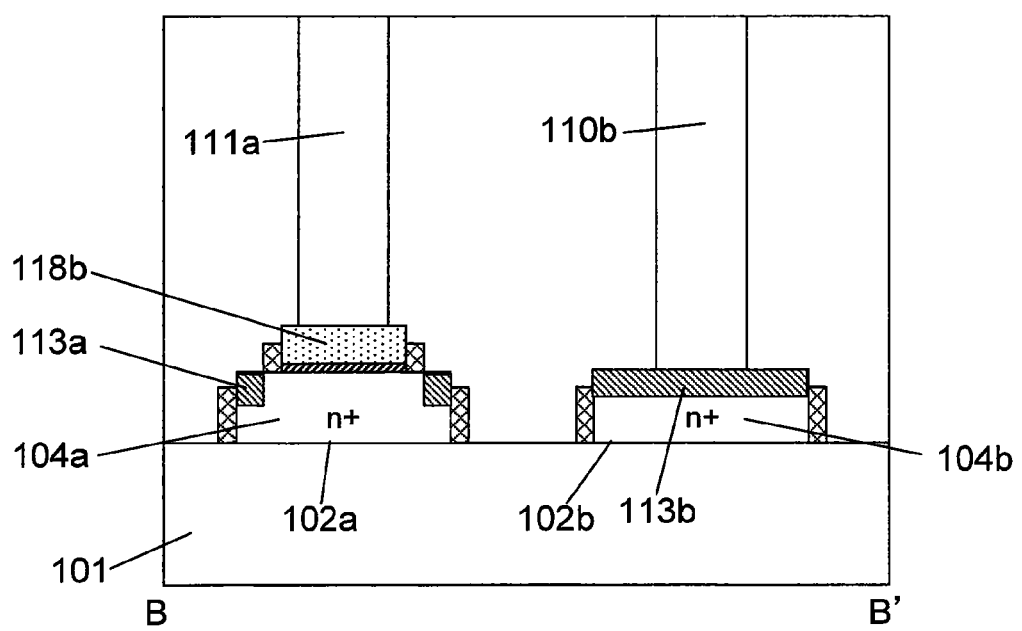
FIG. 3(b) is a sectional view showing the memory cell of the SRAM according to the first embodiment.

As shown in FIG. 3(b), the planar silicon layer (102a, 102b) serving as a storage node is formed on the buried oxide film layer 101, and an N+ drain diffusion layer (104a, 104b) is formed in the planar silicon layer (102a, 102b) by impurity implantation or the like. The silicide layer (113a, 113b) is also formed in a surface of the N+ drain diffusion layer (104a, 104b). A contact 111a formed on a gate line 118b extending from the gate electrode of the driver transistor Qn11 is connected to a contact 110b formed on the N+ drain diffusion layer 104b through a storage node interconnection line Nb1.

Figure 3C:
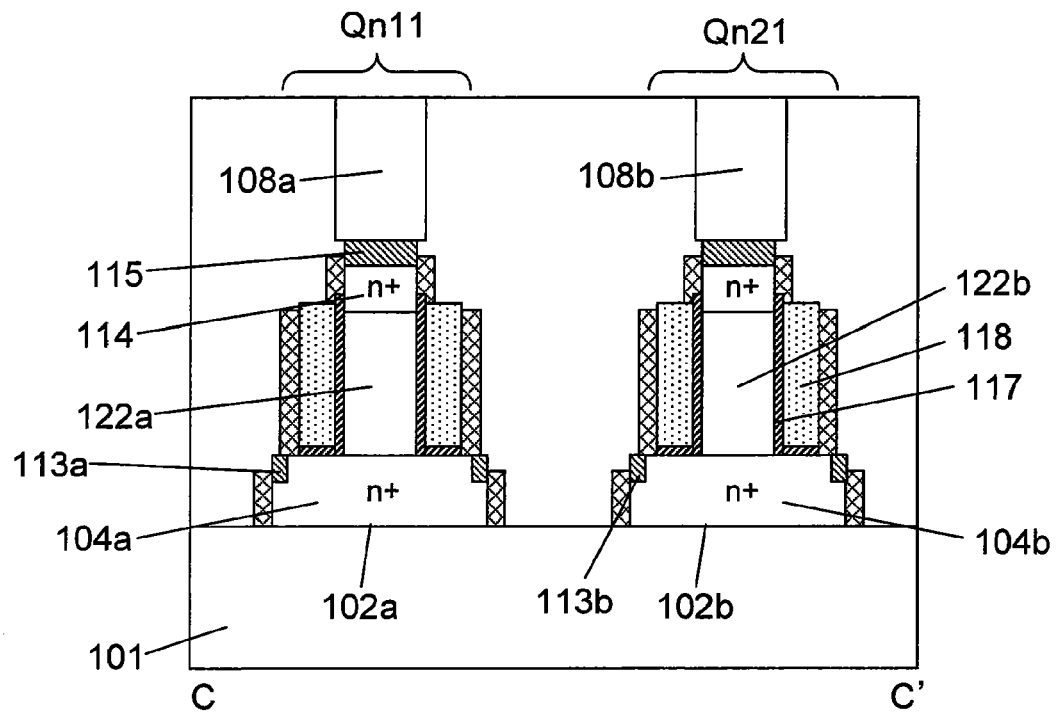
FIG. 3(c) is a sectional view showing the memory cell of the SRAM according to the first embodiment.

As shown in FIG. 3(c), the planar silicon layer (102a, 102b) serving as a storage node is formed on the buried oxide film layer 101, and the N+ drain diffusion layer (104a, 104b) is formed in the planar silicon layer (102a, 102b) by impurity implantation or the like. The silicide layer (113a, 113b) is formed in the surface of the N+ drain diffusion layer (104a, 104b). A pillar-shaped silicon layer 122a constituting a driver transistor Qn11 is formed on the N+ drain diffusion layer 104a, and a pillar-shaped silicon layer 122b constituting a driver transistor Qn21 is formed on the N+ drain diffusion layer 104b. The gate dielectric film 117 and the gate electrode 118 are formed around each of the pillar-shaped silicon layers. An N+ source diffusion layer 114 is formed in an upper portion of the pillar-shaped silicon layer (122a, 122b) by impurity implantation or the like, and the silicide layer 115 is also formed in a surface of the source diffusion layer. A contact (108a, 108b) formed on the driver transistor (Qn11, Qn21) is connected to a ground potential line Vss1 through an interconnection layer.

Figure 3D:
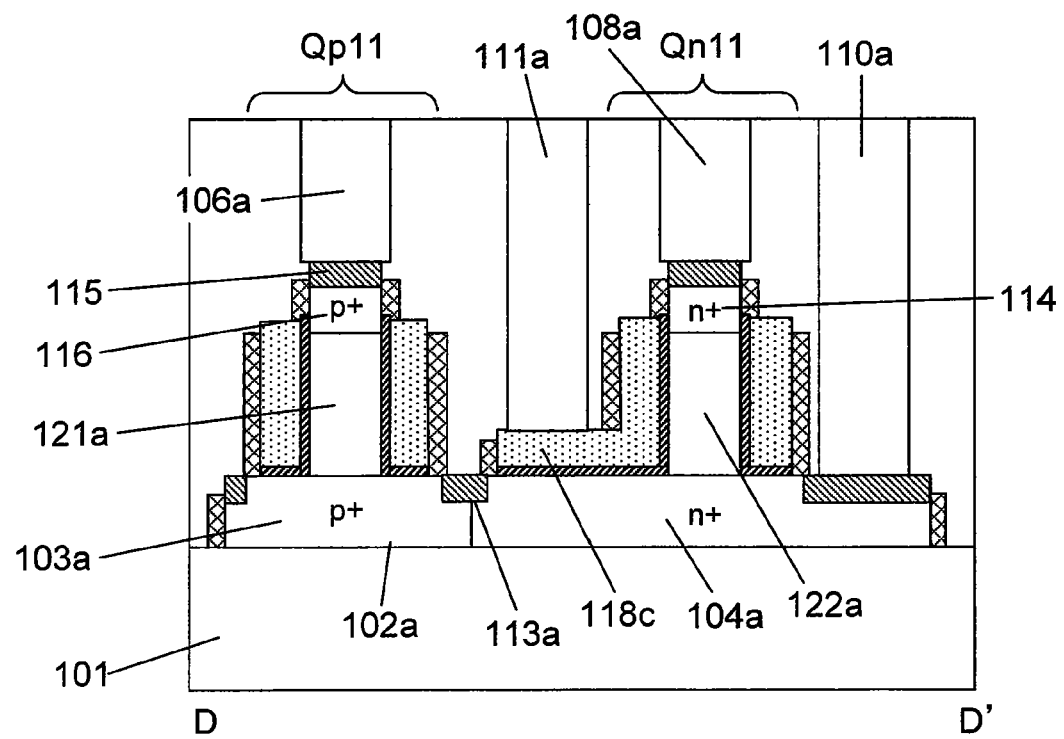
FIG. 3(d) is a sectional view showing the memory cell of the SRAM according to the first embodiment.
Figure 4:
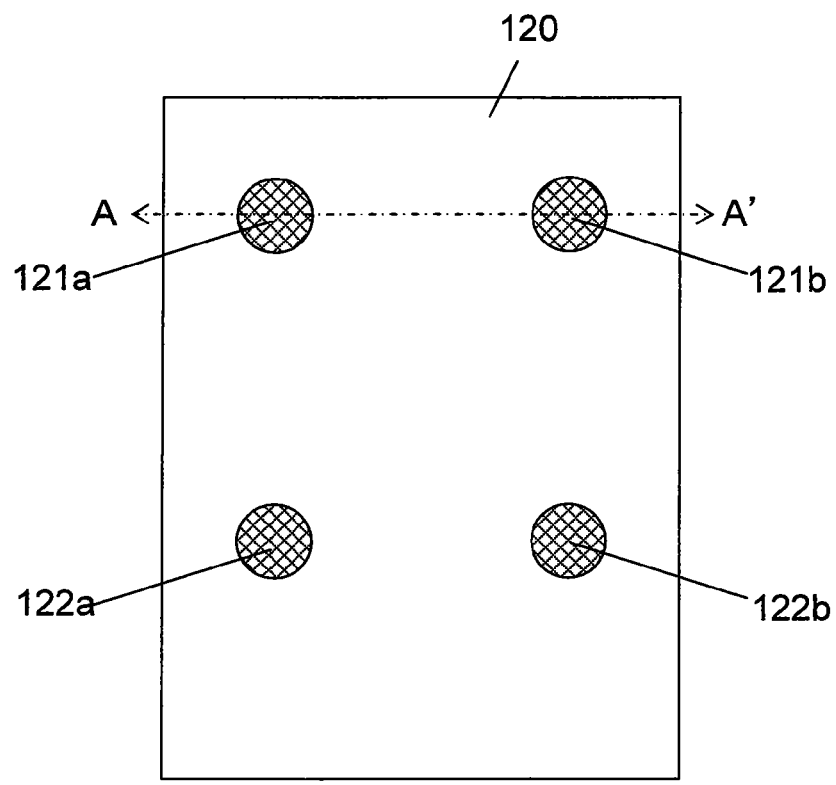
FIGS. 4(a) and 4(b) are process diagrams showing a production process of the SRAM according to the first embodiment, on a step-by-step basis.
Figure 4:
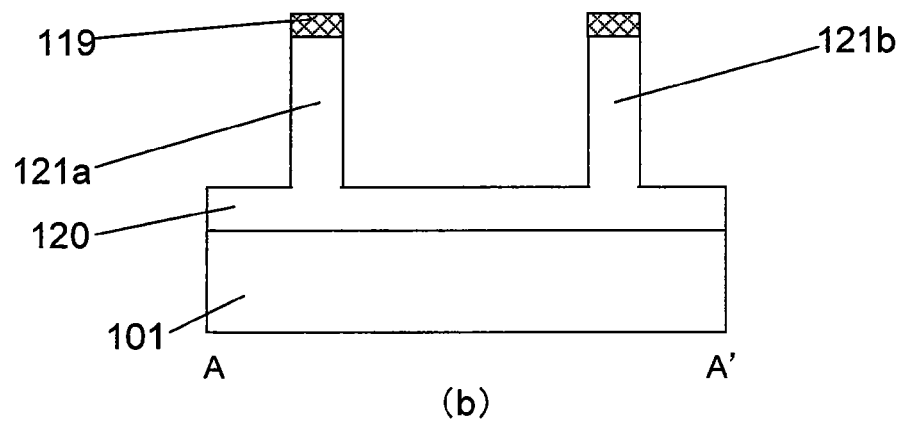
Figure 5:
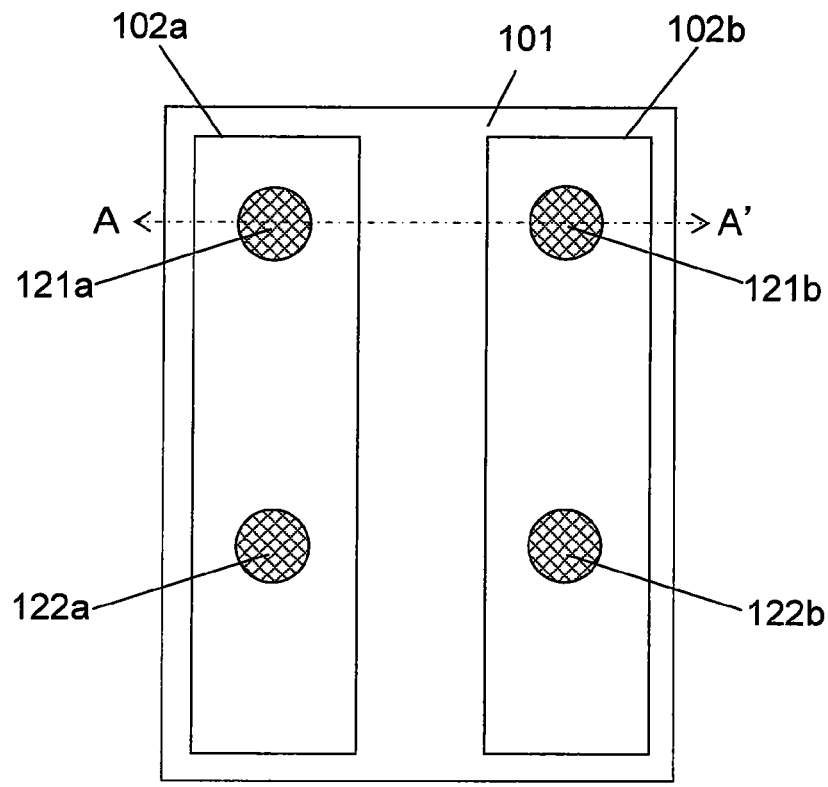
FIGS. 5(a) and 5(b) are process diagrams showing the production process of the SRAM according to the first embodiment, on a step-by-step basis.
Figure 5:
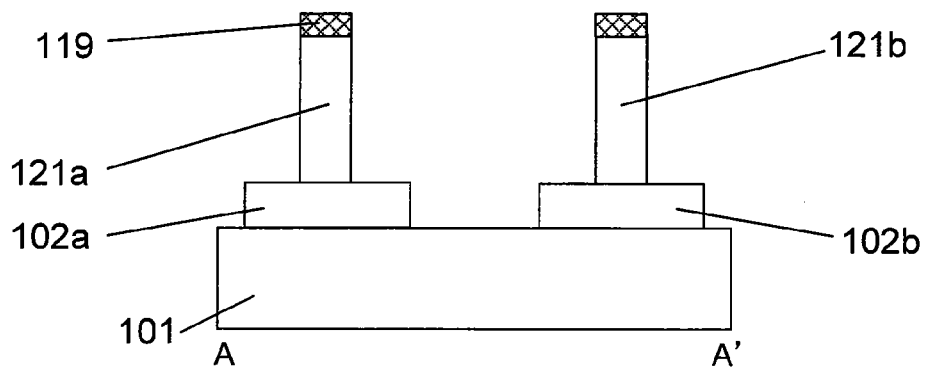
Figure 6:
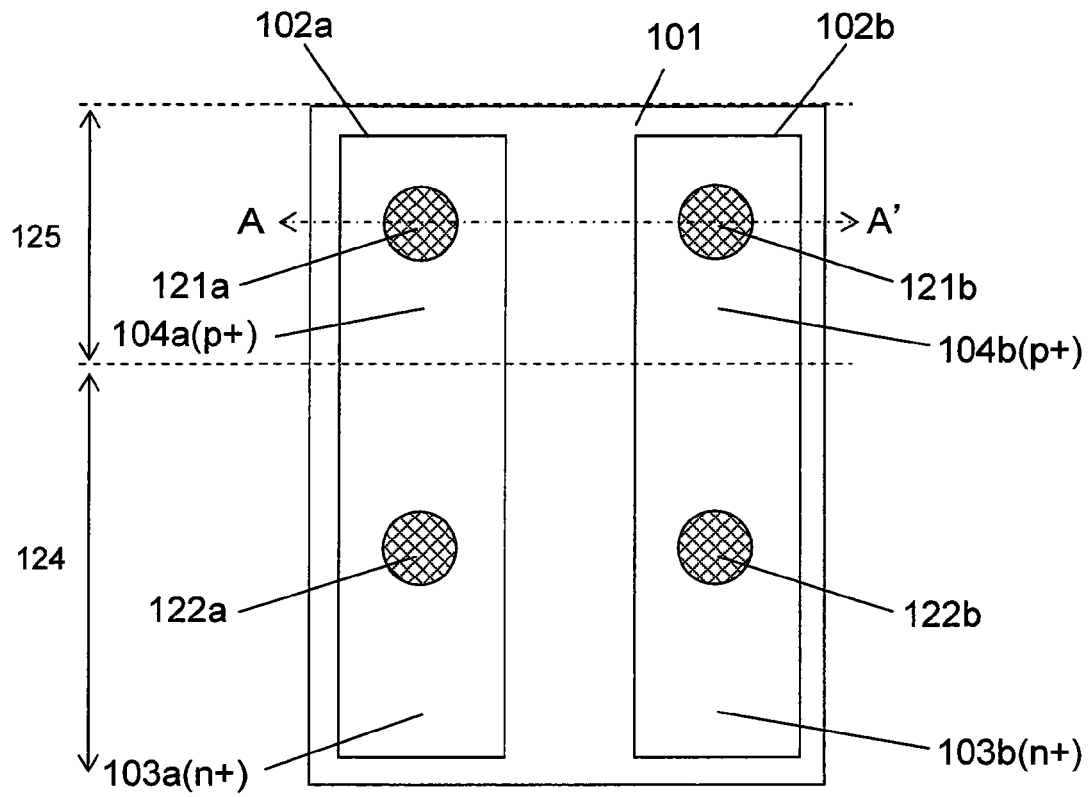
FIGS. 6(a) and 6(b) are process diagrams showing the production process of the SRAM according to the first embodiment, on a step-by-step basis.
Figure 6:
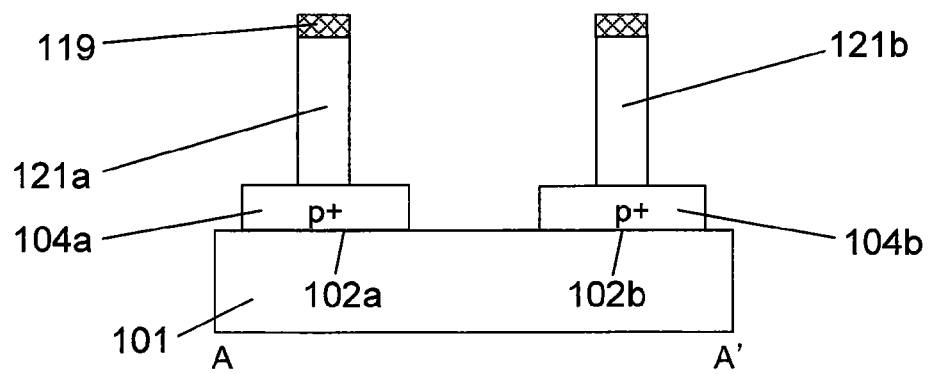
Figure 7:
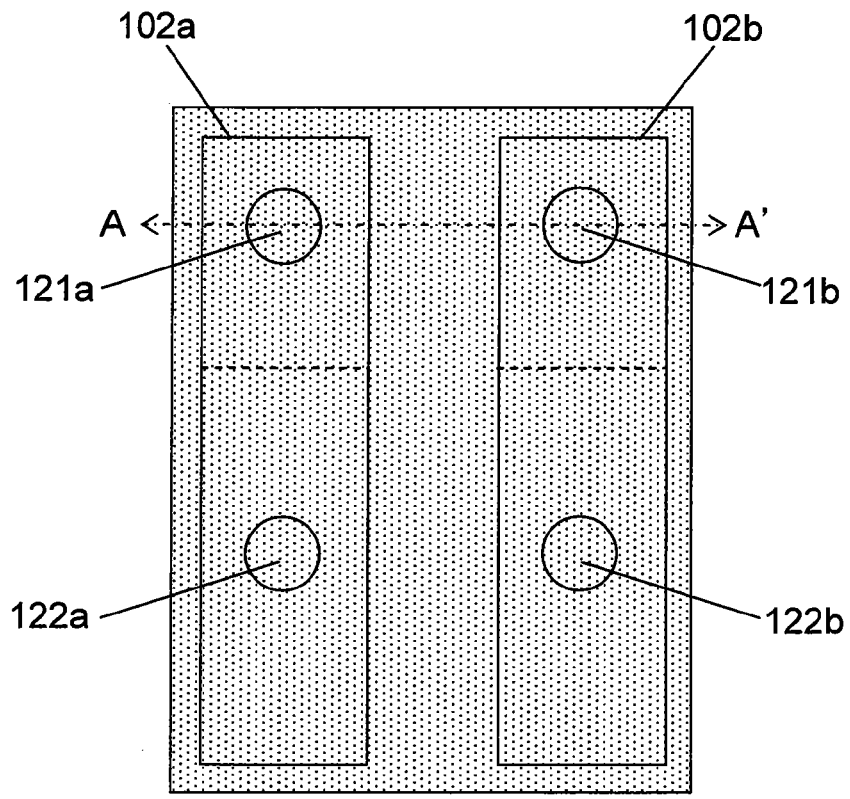
FIGS. 7(a) and 7(b) are process diagrams showing the production process of the SRAM according to the first embodiment, on a step-by-step basis.
Figure 7:
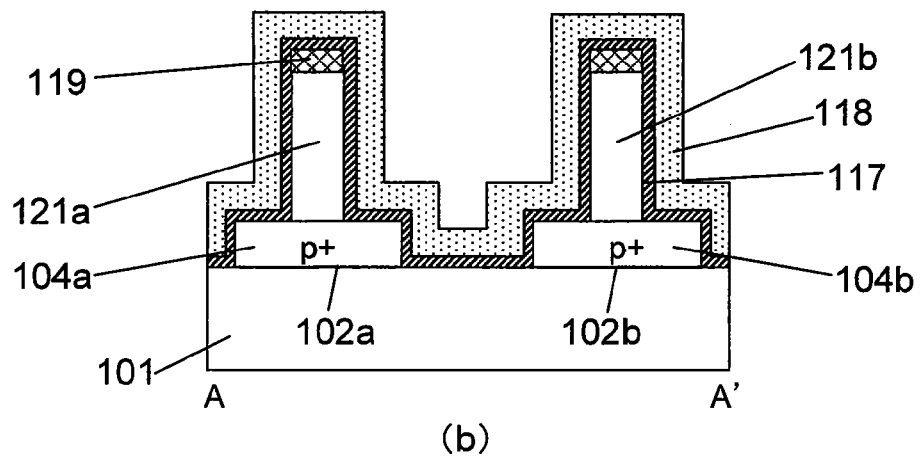
Figure 8:
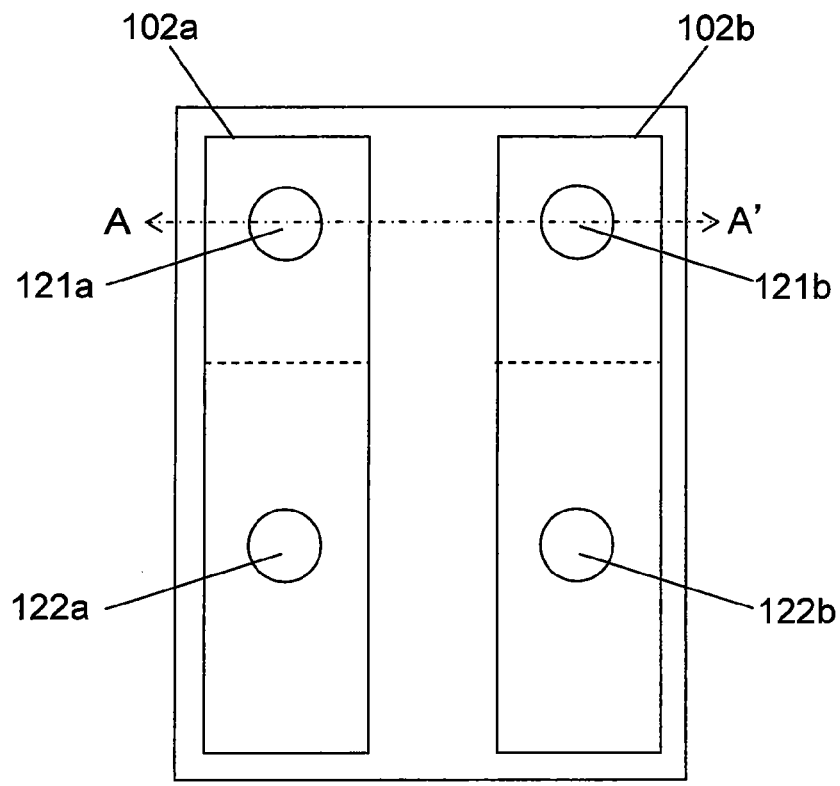
FIGS. 8(a) and 8(b) are process diagrams showing the production process of the SRAM according to the first embodiment, on a step-by-step basis.
Figure 8:
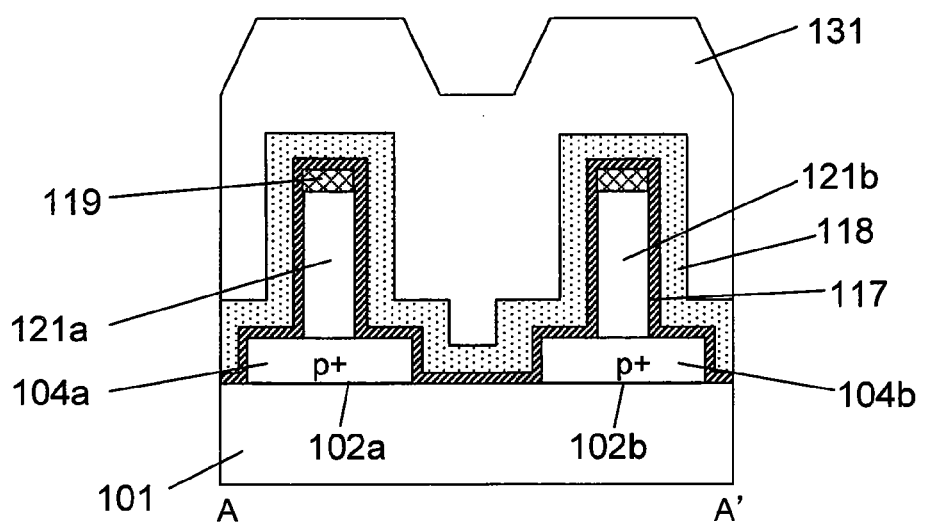
Figure 9:
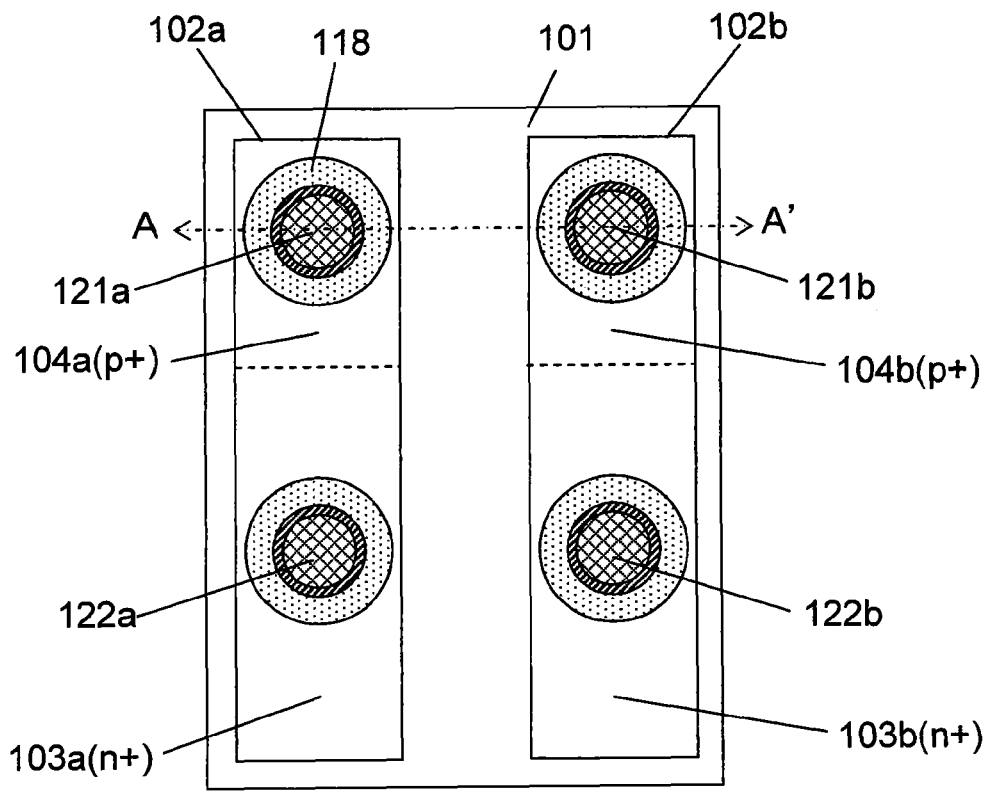
FIGS. 9(a) and 9(b) are process diagrams showing the production process of the SRAM according to the first embodiment, on a step-by-step basis.
Figure 9:
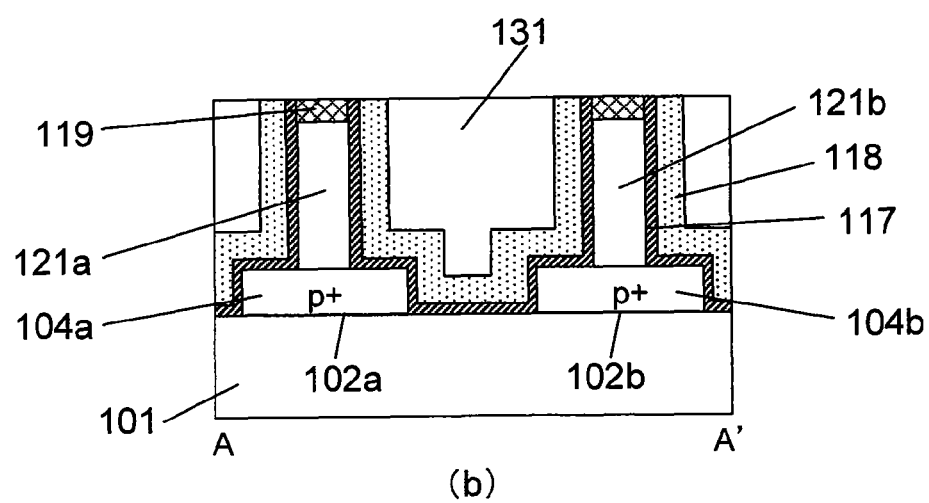
Figure 10:
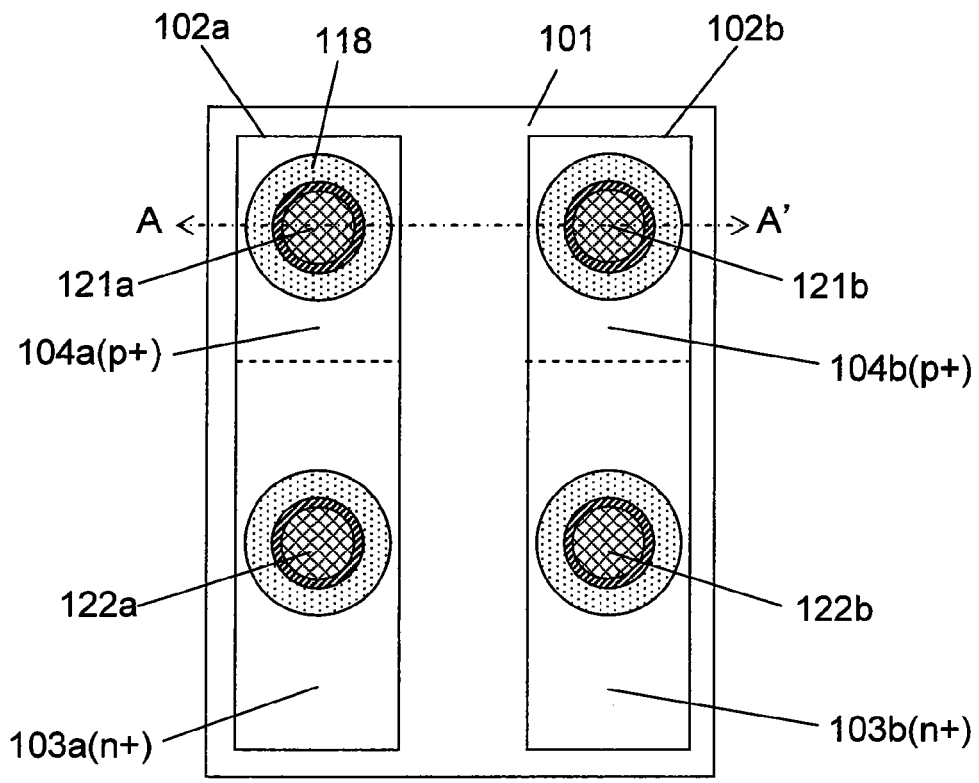
FIGS. 10(a) and 10(b) are process diagrams showing the production process of the SRAM according to the first embodiment, on a step-by-step basis.
Figure 10:
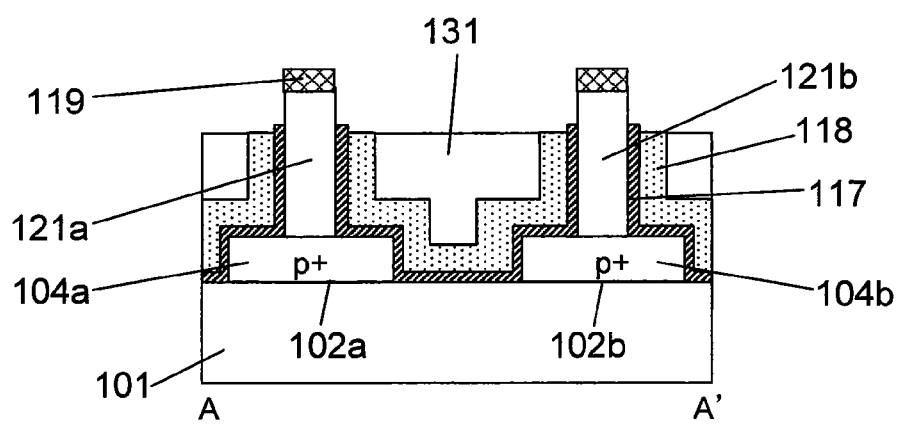
Figure 11:
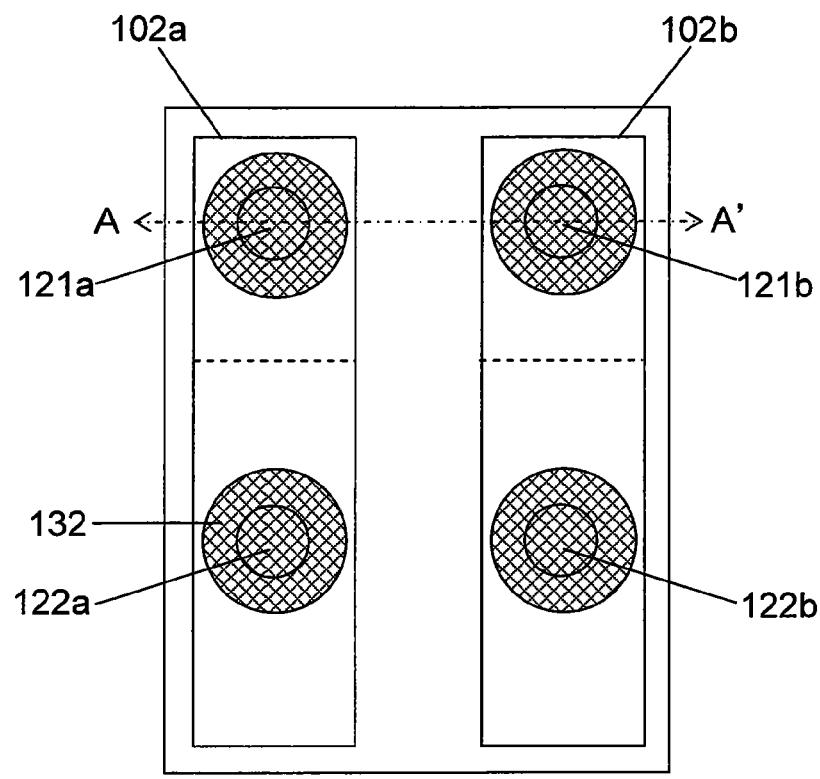
FIGS. 11(a) and 11(b) are process diagrams showing the production process of the SRAM according to the first embodiment, on a step-by-step basis.
Figure 11:
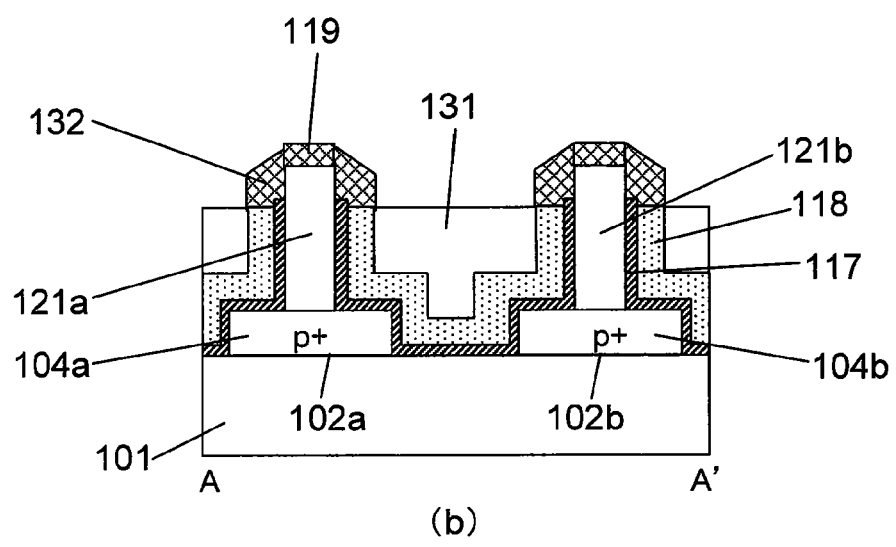
Figure 12:
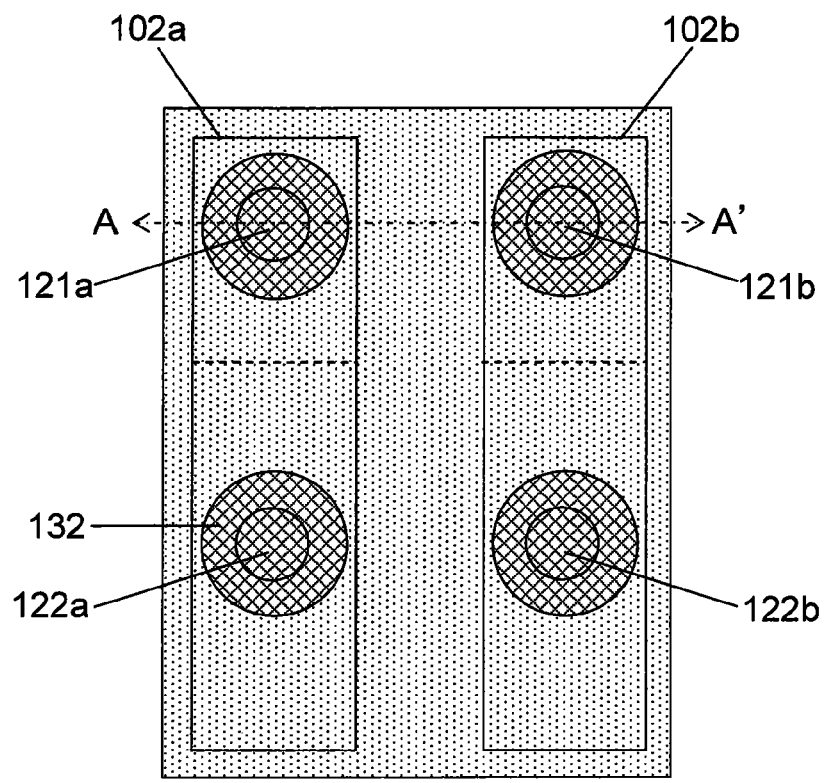
FIGS. 12(a) and 12(b) are process diagrams showing the production process of the SRAM according to the first embodiment, on a step-by-step basis.
Figure 12:
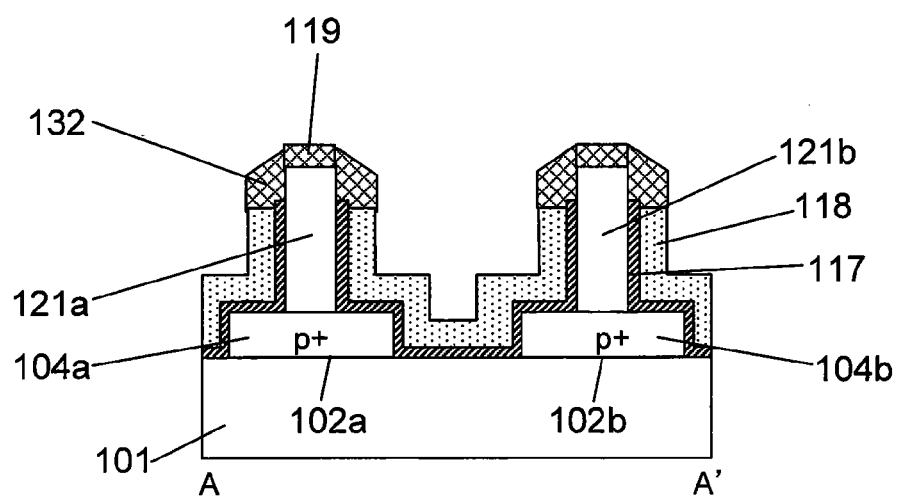
Figure 13:
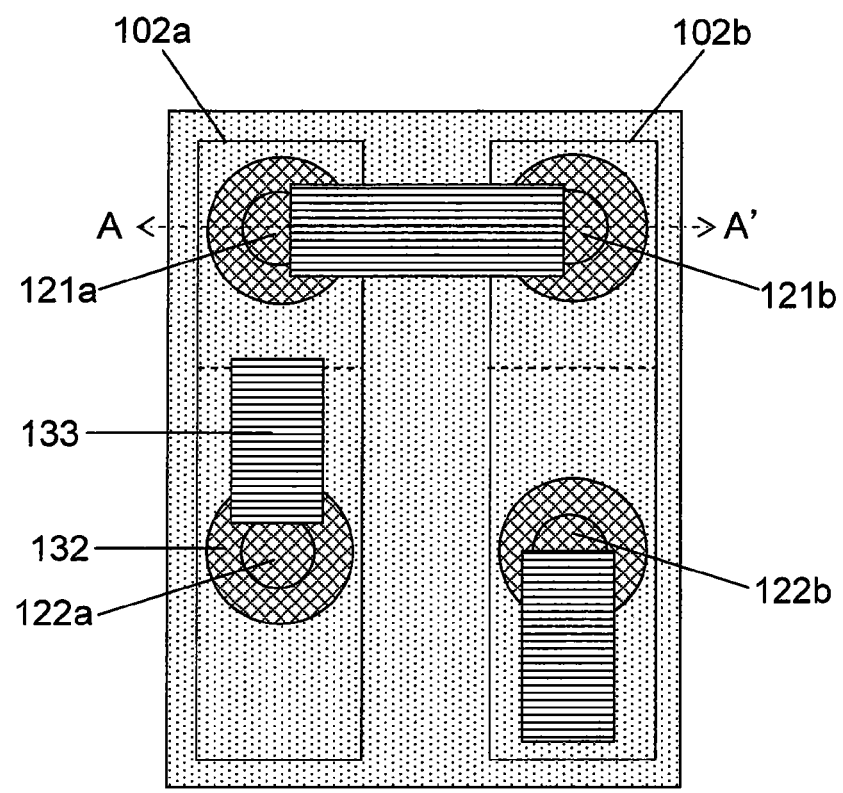
FIGS. 13(a) and 13(b) are process diagrams showing the production process of the SRAM according to the first embodiment, on a step-by-step basis.
Figure 13:
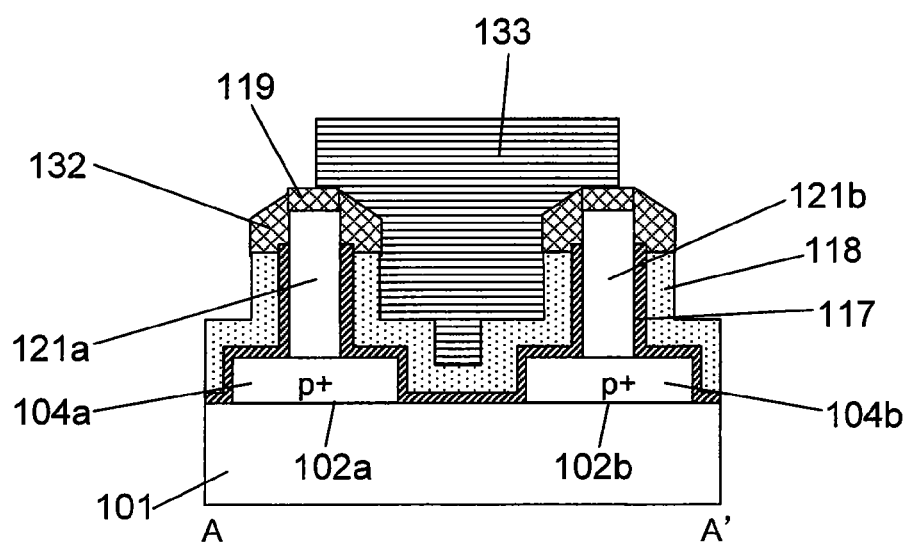
Figure 14:
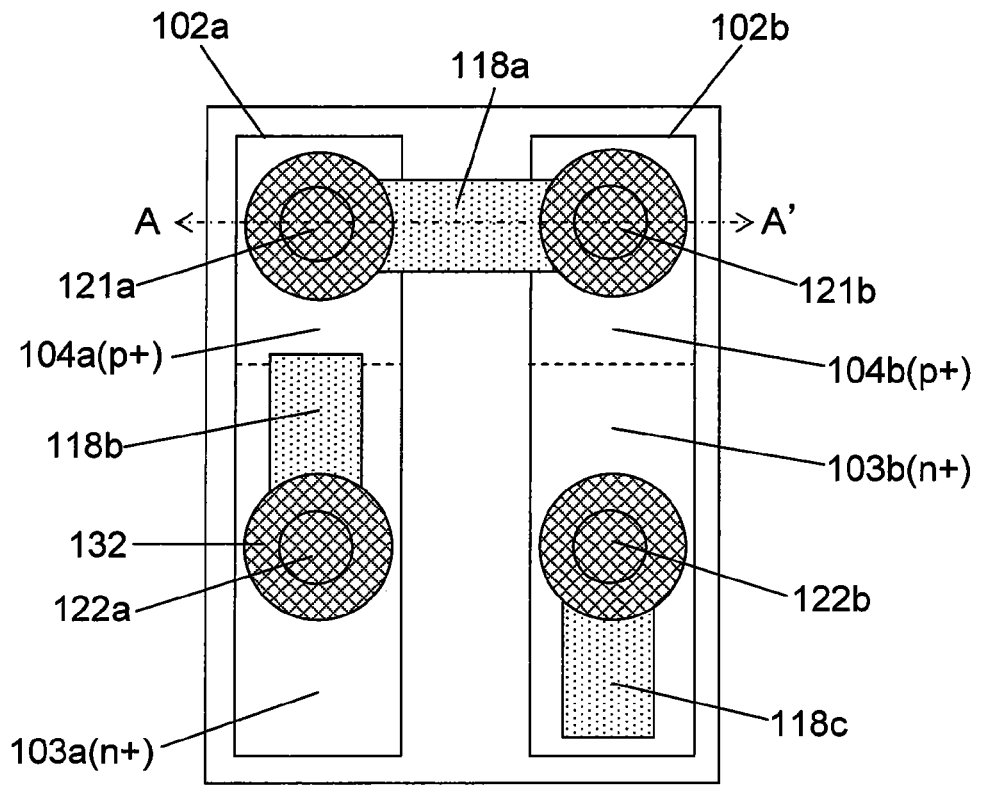
FIGS. 14(a) and 14(b) are process diagrams showing the production process of the SRAM according to the first embodiment, on a step-by-step basis.
Figure 14:
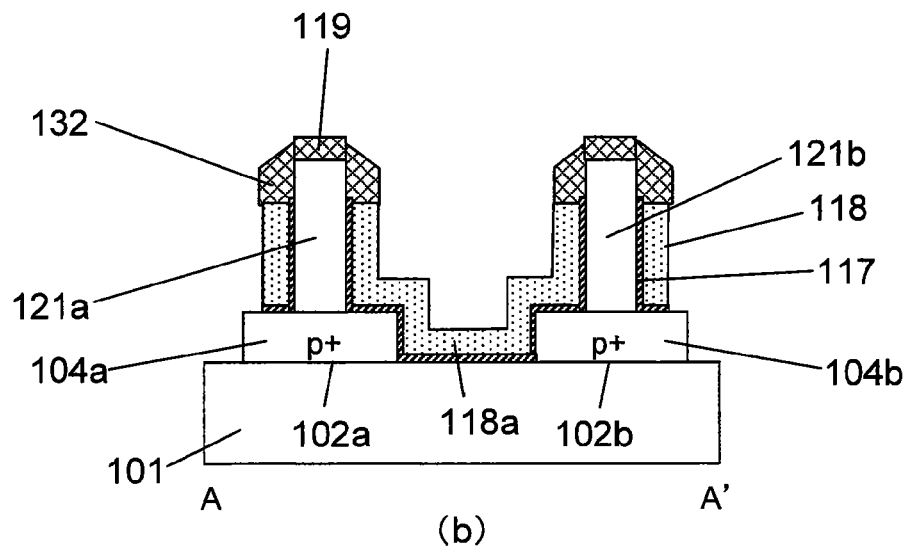
Figure 15:
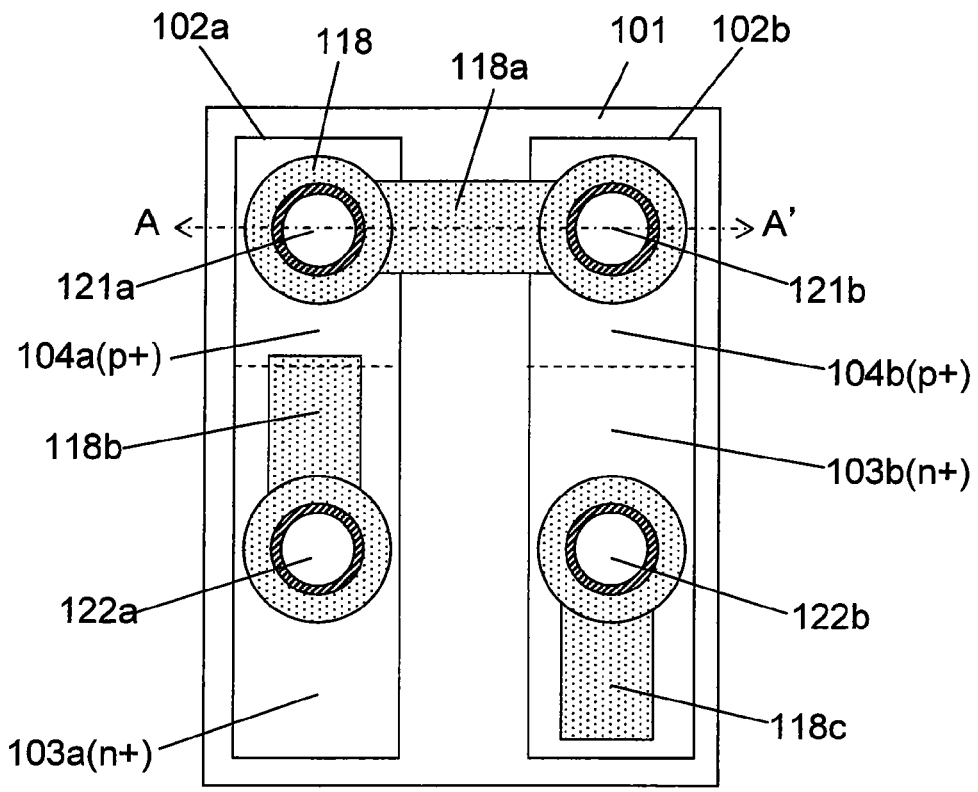
FIGS. 15(a) and 15(b) are process diagrams showing the production process of the SRAM according to the first embodiment, on a step-by-step basis.
Figure 15:
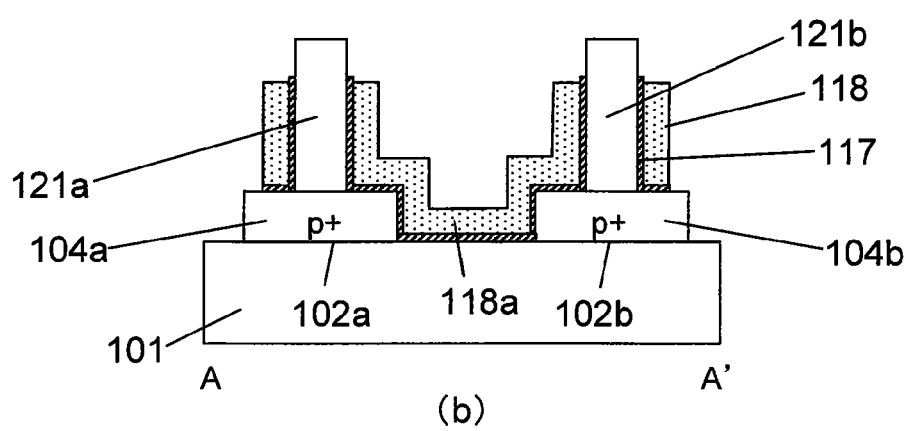
Figure 16:
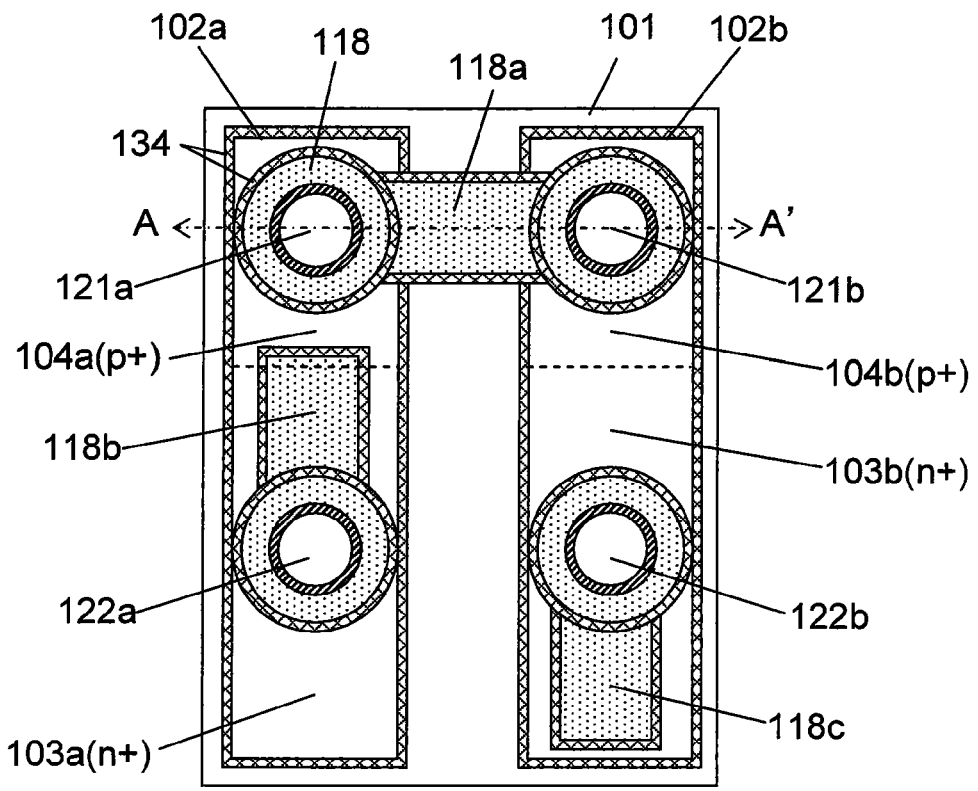
FIGS. 16(a) and 16(b) are process diagrams showing the production process of the SRAM according to the first embodiment, on a step-by-step basis.
Figure 16:
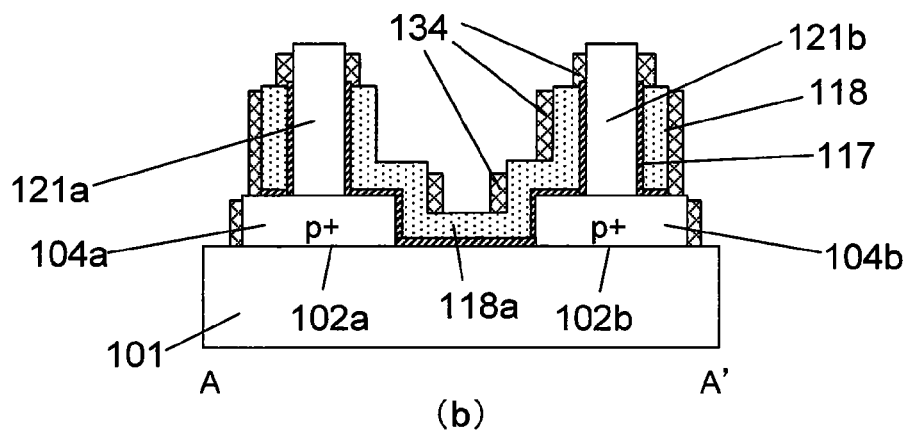
Figure 17:
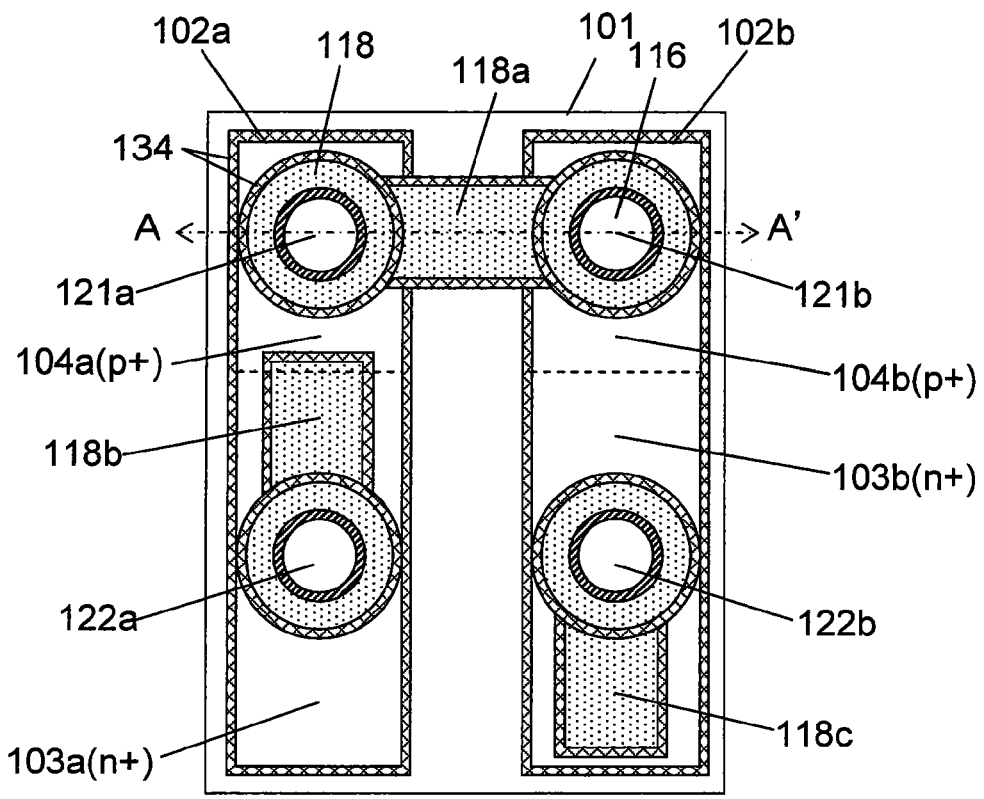
FIGS. 17(a) and 17(b) are process diagrams showing the production process of the SRAM according to the first embodiment, on a step-by-step basis.
Figure 17:
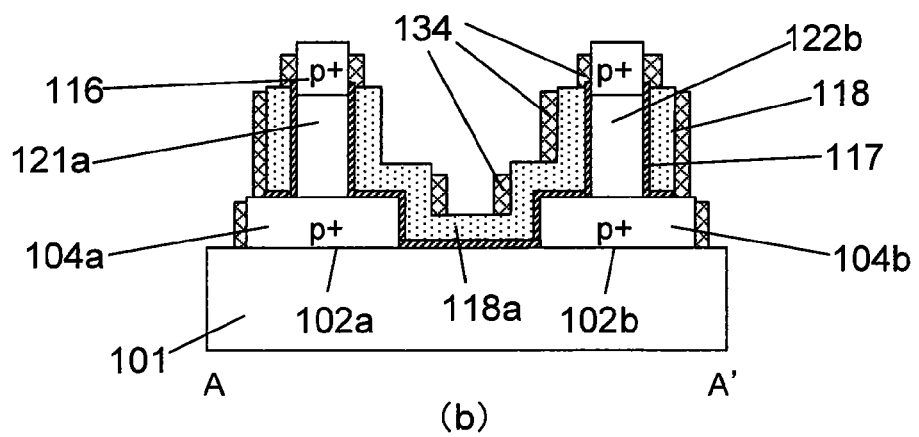
Figure 18:
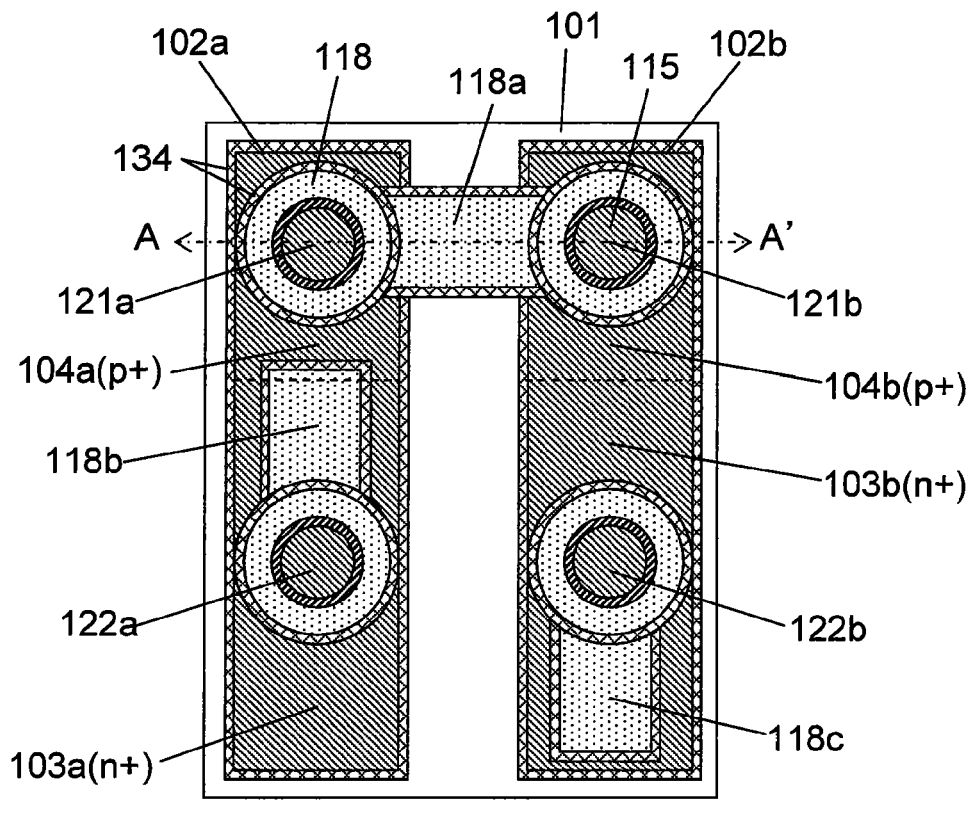
FIGS. 18(a) and 18(b) are process diagrams showing the production process of the SRAM according to the first embodiment, on a step-by-step basis.
Figure 18:
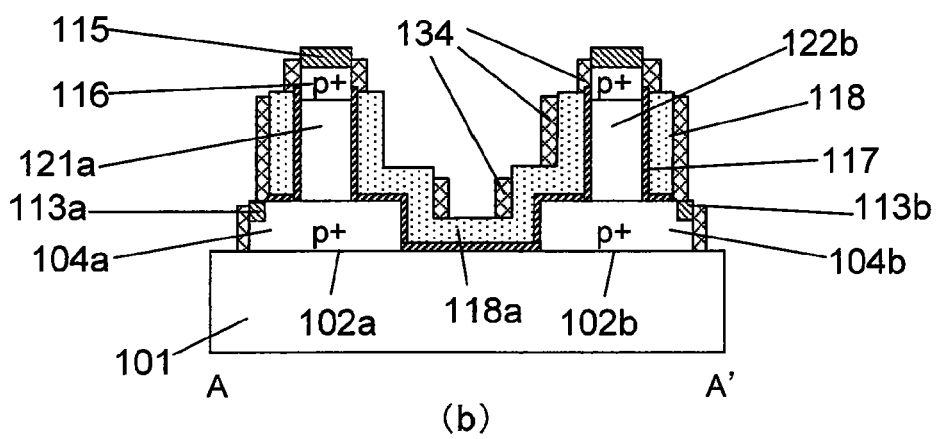
Figure 19:
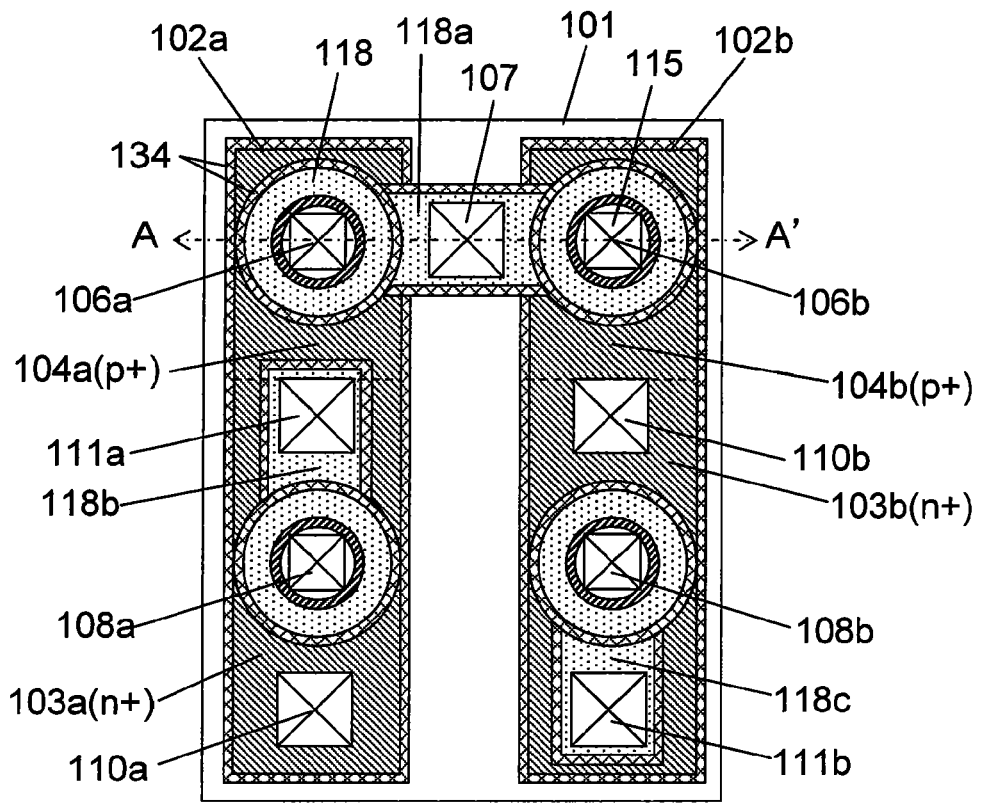
FIGS. 19(a) and 19(b) are process diagrams showing the production process of the SRAM according to the first embodiment, on a step-by-step basis.
Figure 19:
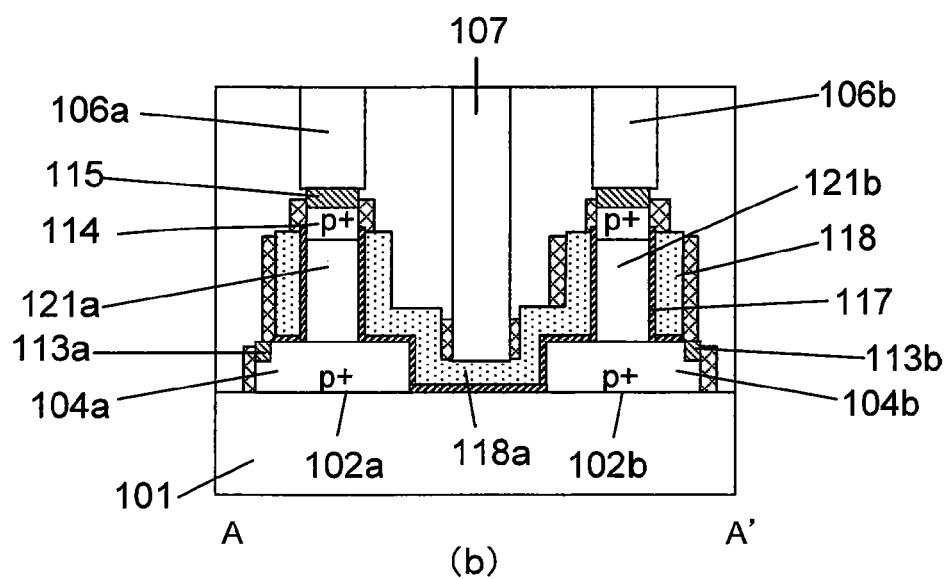

As shown in FIG. 3(d), the planar silicon layer 102a serving as a storage node is formed on the buried oxide film layer 101, and the P+ drain diffusion layer 103a and the N+ drain diffusion layer 104a are formed in the planar silicon layer 102a by impurity implantation or the like. The silicide layer 113a is formed in the surface of the drain diffusion layer (103a, 104a), so that the P+ drain diffusion layer 103a and the N+ drain diffusion layer 104a are directly connected to each other through the silicide layer 113a. This is effective to reduce a memory cell area.

The pillar-shaped silicon layer 121a constituting the access transistor Qp11 is formed on the P+ drain diffusion layer 103a, and the pillar-shaped silicon layer 122a constituting the driver transistor Qn11 is formed on the N+ drain diffusion layer 104a. The P+ drain diffusion layer 103a and the N+ drain diffusion layer 104a are directly connected to each other through the silicide layer 113a formed in a surface of the planar silicon layer 102a. The gate dielectric film 117 and the gate electrode 118 are formed around each of the pillar-shaped silicon layers. The source diffusion layer is formed in the upper portion of each of the pillar-shaped silicon layers by impurity implantation or the like, and the silicide layer 115 is formed in the surface of the source diffusion layer. The contact 106a formed on the access transistor Qp11 is connected to the bit line BL1, and the contact 108a formed on the driver transistor Qn11 is connected to a ground potential line Vss1.

The contact 111a formed on the gate line 118b extending from the gate electrode of the driver transistor Qn11 is connected to the contact 110b formed on the drain diffusion layer of the planar silicon layer 102b, through the storage node interconnection line Nb1. A contact 110a is formed on the N+ drain diffusion layer 104a and connected to a contact 111b formed on a gate line 18d extending from the gate electrode of the driver transistor Qn21, through the storage node interconnection line Na1.

As above, in the first embodiment, the N+ drain diffusion layer and the P+ drain diffusion layer each formed in the planar silicon layer (102a, 102b) serving as a storage node are directly connected to each other through the silicide layer formed in the surface of the planar silicon layer, so that the drain diffusion layers of the access transistor and the driver transistor serve as a storage node of the SRAM cell in a shared manner. Thus, element isolation is required only for isolating between the two storage nodes of the SRAM cell, without a need for element isolation for isolating between the N+ and P+ source/drain diffusion layers, which is generally necessary for a planar transistor. This makes it possible to achieve an extremely small SRAM cell area.

Preferably, in the first embodiment, the gate dielectric film is made of a High-k material, such as $HfO_2$, and the gate electrode is made of a metal, such as TiN or TaN, or formed in a laminated structure comprising a metal film and a partially-silicided polysilicon film.

Preferably, in the first embodiment, a channel region of the pillar-shaped silicon layer is doped with no impurity, or has an impurity concentration of $1\ e^{-17}\ cm^{-3}$ or less. The reason is that, if the impurity concentration is greater than this value, a variation in transistor characteristics due to statistical fluctuation of impurities becomes large to cause significant deterioration in SRAM operation margin, such as reading margin. In this case, a threshold voltage adjustment of the transistor may be performed by adjusting a work function of a gate material, instead of the impurity concentration in the channel region.

With reference to FIGS. 4(a) to 19(b), one example of a production method for forming a semiconductor device of the present invention will be described below. In FIGS. 4(a) to 19(b), the figure suffixed with (a) is a top plan view, and the figure suffixed with (b) is a sectional view taken along the line A-A'.

As shown in FIGS. 4(a) and 4(b), a mask 119 of a silicon nitride film having a film thickness of about 50 to 100 nm is formed on an SOI substrate in which a silicon layer having a film thickness of about 100 to 400 nm is formed on a buried oxide film layer 101. Then, a pattern for a pillar-shaped silicon layer (121a, 121b, 122a, 122b) is formed by lithography, and the silicon layer is etched to form the pillar-shaped silicon layer (121a, 121b, 122a, 122b). The pillar-shaped silicon layer has a diameter of about 5 to 50 nm, and a height dimension of about 30 to 300 nm. In this step, a continuous planar silicon layer 120 is formed underneath the pillar-shaped silicon layer to have a thickness of about 10 to 50 nm.

As shown in FIGS. 5(a) and 5(b), the continuous planar silicon layer 120 is divided to form a planar silicon layer (102a, 102b) serving as a storage node. In this example, an element isolation region can be formed simply by dividing the continuous planar silicon layer. Thus, the element isolation region can be formed to have an isolation width equivalent to a minimum fabrication size, through a process having a less number of steps.

As shown in FIGS. 6(a) and 6(b), an impurity is introduced into each of an N+ implantation zone 124 and a P+ implantation zone 125, by ion implantation or the like, to form a drain diffusion layer in the planar silicon layer underneath the pillar-shaped silicon layer. Preferably, conditions for the implantation are adjusted to allow the impurity to be distributed to reach the buried oxide film 101 and cover a bottom of the pillar-shaped silicon layer. In this step, the silicon nitride film 119 prevents the impurity from being introduced into an upper portion of the pillar-shaped silicon layer.

As shown in FIGS. 7(a) and 7(b), a High-k film 117, such as an HfO$_2$ film, is formed as a gate dielectric film to have a thickness of about 1 to 5 nm, by a chemical vacuum deposition (CVD) process or an atomic layer deposition (ALD) process. Subsequently, a metal film 118, such as a TiN film or a TaN film, is formed as a gate conductive film to have a thickness of about 10 to 50 nm.

As shown in FIGS. 8(a) and 8(b), a silicon oxide film 131 is formed to fill a space between the pillar-shaped silicon layers.

As shown in FIGS. 9(a) and 9(b), the silicon oxide film 131, and respective portions of the gate conductive film 118 and the High-k film 117 above the pillar-shaped silicon layer, are polished by chemical mechanical polishing (CMP), to flatten a top surface of a gate. The flattening of the top surface of the gate by the CMP makes it possible to achieve an adequate gate configuration and suppress a variation in gate length. During the CMP, the silicon nitride film-based mask 119 on a top of the pillar-shaped silicon layer is used as a CMP stopper. The use of the silicon nitride film-based mask 119 as a CMP stopper makes it possible to control an amount of CMP with high repeatability.

As shown in FIGS. 10(a) and 10(b), the gate conductive film 118 and the silicon oxide film 131 are etched back to form a gate electrode on a sidewall of the pillar-shaped silicon layer so as to set a gate length. Conditions for the etching are adjusted to allow the gate conductive film 118 and the silicon oxide film 131 to be etched preferably at the same rate, and at a higher selectivity ratio relative to the silicon nitride film-based mask 119.

As shown in FIGS. 11(a) and 11(b), a silicon nitride film is formed and then etched back to form a silicon nitride film-based sidewall 132 on a top of the metal gate. In this step, an amount of the silicon nitride film to be formed and an amount of the silicon nitride film to be etched back are set to allow the silicon nitride film-based sidewall 132 remaining on the gate to accurately cover the gate. A portion of the gate covered by the silicon nitride film-based sidewall will be protected during etching in a subsequent step, so that the gate electrode is formed to have a film thickness of the gate conductive film, in a self-alignment manner.

As shown in FIGS. 12(a) and 12(b), the silicon oxide film 131 remaining on the metal gate is removed by wet etching.

As shown in FIGS. 13(a) and 13(b), a pattern for a gate line is formed by lithography using a resist or multilayer resist 133.

As shown in FIGS. 14(a) and 14(b), a bottom portion of the gate and the High-k film underneath the gate are removed by etching using the resist 33 as a mask. Consequently, a gate line (118a to 118c) is formed. As above, based on the structure where the silicon nitride film is formed on the top of the pillar-shaped silicon layer, the flattening of the top surface of the gate by CMP, the etching for setting the gate length, the formation of the silicon nitride film-based sidewall for protecting the gate electrode, the formation of the pattern for the gate line, and the etching for forming the gate line, are sequentially performed. This makes it possible to form the gate in an adequate configuration and with a small variation in size, and freely form the gate line. In addition, a film thickness of the gate electrode can be controlled in a self-alignment manner, which makes it possible to reduce an occupancy area, and suppress a parasitic resistance between the diffusion layers.

As shown in FIGS. 15(a) and 15(b), the silicon nitride film-based mask 119 and the silicon nitride film-based sidewall 132 are removed by wet etching.

As shown in FIGS. 16(a) and 16(b), a silicon nitride film having a film thickness of about 10 to 50 nm is formed and then etched back to form a structure where a sidewall of an upper portion of the pillar-shaped silicon layer and a sidewall of the gate are covered by the silicon nitride film 134. This structure allows the high-k film 117 to be covered by the silicon nitride film 134, so as to prevent the high-k film 117 from being damaged by wet treatment and impurity implantation in subsequent steps.

In this step, it is necessary to select an optimal film thickness of the silicon nitride film, because an excessively small film thickness of the silicon nitride film makes it impossible to fully prevent the damage of the high-k film 117, and an excessively large film thickness of the silicon nitride film causes an increase in occupancy area by just the film thickness thereof formed on the sidewall of the gate.

As shown in FIGS. 17(a) and 17(b), an impurity is introduced into each of the N+ implantation zone and the P+ implantation zone, by ion implantation or the like, to form a source diffusion layer (114, 116) in an upper portion of the pillar-shaped silicon layer.

As shown in FIGS. 18(a) and 18(b), each of the drain and source diffusion layers is selectively silicided through sputtering of a metal, such as Co or Ni, and a heat treatment, to form a silicide layer (113a, 113b) on the drain diffusion layers, and a silicide layer 115 on the source diffusion layers in the upper portions of the pillar-shaped silicon layers. The N+ diffusion layer and the P+ diffusion layer in each of the planar silicon layers are connected to each other through the silicide layer (113a, 113b).

In this structure, the silicon nitride film 134 covering the sidewall of the pillar-shaped silicon layer and the gate electrode can suppress short-circuiting between the drain and the gate and between the source and the gate due the silicide layers.

As shown in FIGS. 19(a) and 19(b), after forming a silicon oxide film serving as an interlayer film, a contact (106a to 111a, 106b to 111b) is formed.

Preferably, in the first embodiment, an impurity distribution is set to allow the drain diffusion layer (103a, 104a, 103b, 104b) underneath the pillar-shaped silicon layer to be formed to reach the buried oxide film layer 101, and an impurity concentration and a size of the pillar-shaped silicon layer are set to allow an inside of the pillar-shaped silicon layer to become fully depleted during a transistor operation. As a result of setting the impurity distribution in the drain diffusion layer (103a, 104a, 103b, 104b) in the above manner, the inside of the pillar-shaped silicon layer is kept in a floating body structure irrespective of a transistor operation state, which makes it possible to form a transistor insusceptible to a substrate voltage. In addition, as a result of diffusing the impurity for the drain diffusion layer (103a, 104a, 103b, 104b) to reach the buried oxide film 101, a capacitance component in a bottom of the drain diffusion layer is significantly reduced, so that a total parasitic capacitance of the drain diffusion layer can be reduced. In the sectional views of FIGS. 3(a) to 3(d), the impurity is diffused to fully cover the bottom of the pillar-shaped silicon layer. However, even if the impurity does not fully cover the bottom of the pillar-shaped silicon layer, there is no problem in transistor operation.

Second Embodiment

Figure 20:
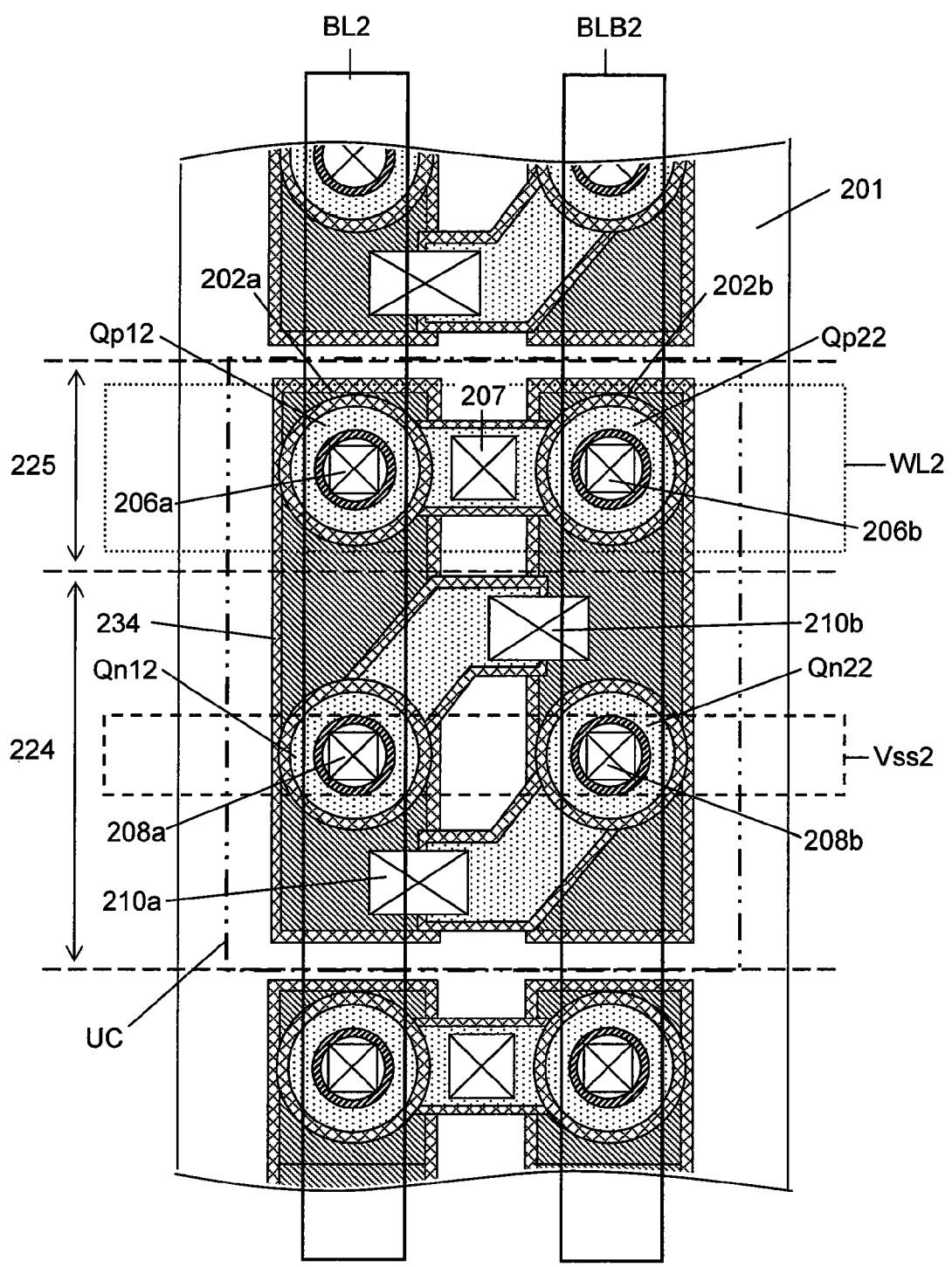
FIG. 20 is a top plan view showing a memory cell of an SRAM according to a second embodiment of the present invention.

FIG. 20 illustrates a layout of a memory cell in an SRAM according to a second embodiment of the present invention. The second embodiment is different from the first embodiment in the following respect. A planar silicon layer 202a serving as a storage node is connected to a gate line extending from a gate electrode of a driver transistor Qn22, through a common contact 210a formed to extend thereacross, and a planar silicon layer 202b serving as a storage node is connected to a gate line extending from a gate electrode of a driver transistor Qn12, through a common contact 21b formed to extend thereacross. As above, the gate and the storage node are connected to each other through the contact, instead of an interconnection layer, so that the number of contacts in the SRAM cell can be reduced. Thus, a cell area can be reduced by adjusting an arrangement of pillar-shaped silicon layers and contacts.

As mentioned in the first embodiment, in order to share each of the word line, the bit line and the ground potential line, with other memory cells, such a line is preferably laid out in a higher-level layer than a node interconnection line to be wired in each of the memory cells. In the second embodiment, the node interconnection line is formed by a contact.

The remaining structure is the same as that in the first embodiment, and its description will be omitted.

Third Embodiment

Figure 21:
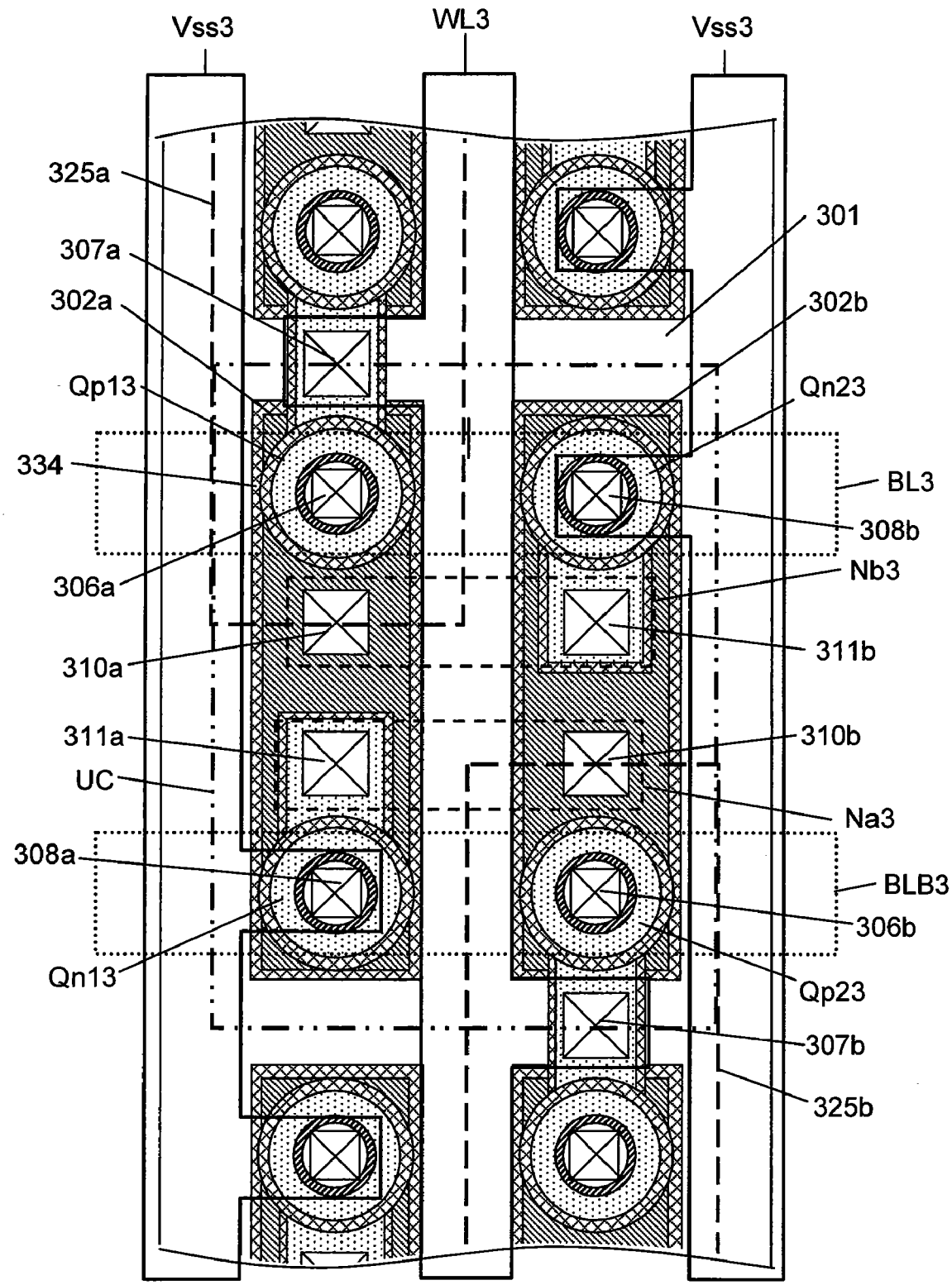
FIG. 21 is a top plan view showing a memory cell of an SRAM according to a third embodiment of the present invention.

FIG. 21 illustrates a layout of a memory cell in an SRAM according to a third embodiment of the present invention. In the third embodiment, an arrangement of two transistors arrayed in a 1st column of a unit cell UC illustrated in FIG. 21 in an SRAM cell array is identical to that of two transistors arrayed in a 2nd column in a memory cell adjacent to and on an upper or lower side of the unit cell UC, and an arrangement of two transistors arrayed in a 2nd column of the unit cell UC is identical to that of two transistors arrayed in a 1st column in the memory cell adjacent to and on the upper or lower side of the unit cell UC. Specifically, two transistors are arrayed on the upper side of transistors Qp13, Qn13 arrayed in the 1st column of the unit cell UC in FIG. 21, in the same arrangement as that of transistors Qn23, Qp23 arrayed in the 2nd column of the unit cell UC in FIG. 21, in this order in a downward direction. Thus, in FIG. 21, an access transistor is disposed adjacent to and on the upper side of the access transistor Qp13, and an access transistor is disposed adjacent to and on the lower side of the access transistor Qp23. In this arrangement of the SRAM cells, a gate line extending from a gate electrode of the access transistor (Qp13, Qp23) can be connected to a gate electrode of the access transistor in the memory cell disposed adjacent to and on the upper or lower side of the unit cell UC in FIG. 21, and a common contact (307a, 307b) connected to a word line WL3 can be formed on the gate line. In the first embodiment, the contact (107a, 107b) connected to the word line WL1 is formed between the storage node 102a and the second storage node 102b. In the third embodiment, the contact (307a, 307b) is disposed on a boundary between the upper and lower SRAM cells, so that a space between the storage nodes can be reduced to reduce a lateral (in FIG. 21) length of the SRAM cell.

As mentioned in the first embodiment, in order to share each of the word line, the bit line and the ground potential line, with other memory cells, such a line is preferably laid out in a higher-level layer than a node interconnection line to be wired in each of the memory cells. As one example of the hierarchical wiring configuration, it is contemplated that a node interconnection line (Na3, Nb3) is wired in a lower-level layer, wherein each of the word line WL3 and a ground potential line (Vss3a, Vss3b) is wired in a mid-level layer, and a bit line (BL3, BLB3) is wired in a higher-level layer, to keep each line from coming in contact with an unintended one of the contacts.

In the third embodiment, the arrangement of the access and driver transistors is changed. Thus, differently from the first embodiment where each of the N$^+$ implantation zone and the P$^+$ implantation zone is defined by simple lines and spaces, a P$^+$ implantation zone (325a, 325b) has a groove pattern, and an N$^+$ implantation zone has a pattern formed by inverting the P$^+$ implantation zone (325a, 325b). Therefore, in patterning of the implantation zones, it is necessary to accurately control a resist pattern.

In the third embodiment, one of the storage nodes may be connected to a gate line extending from a gate electrode of the driver transistor in the other storage node, through a common contact, in the same manner as that in the second embodiment.

The remaining structure is the same as that in the first embodiment, and its description will be omitted.

Fourth Embodiment

Figure 22:
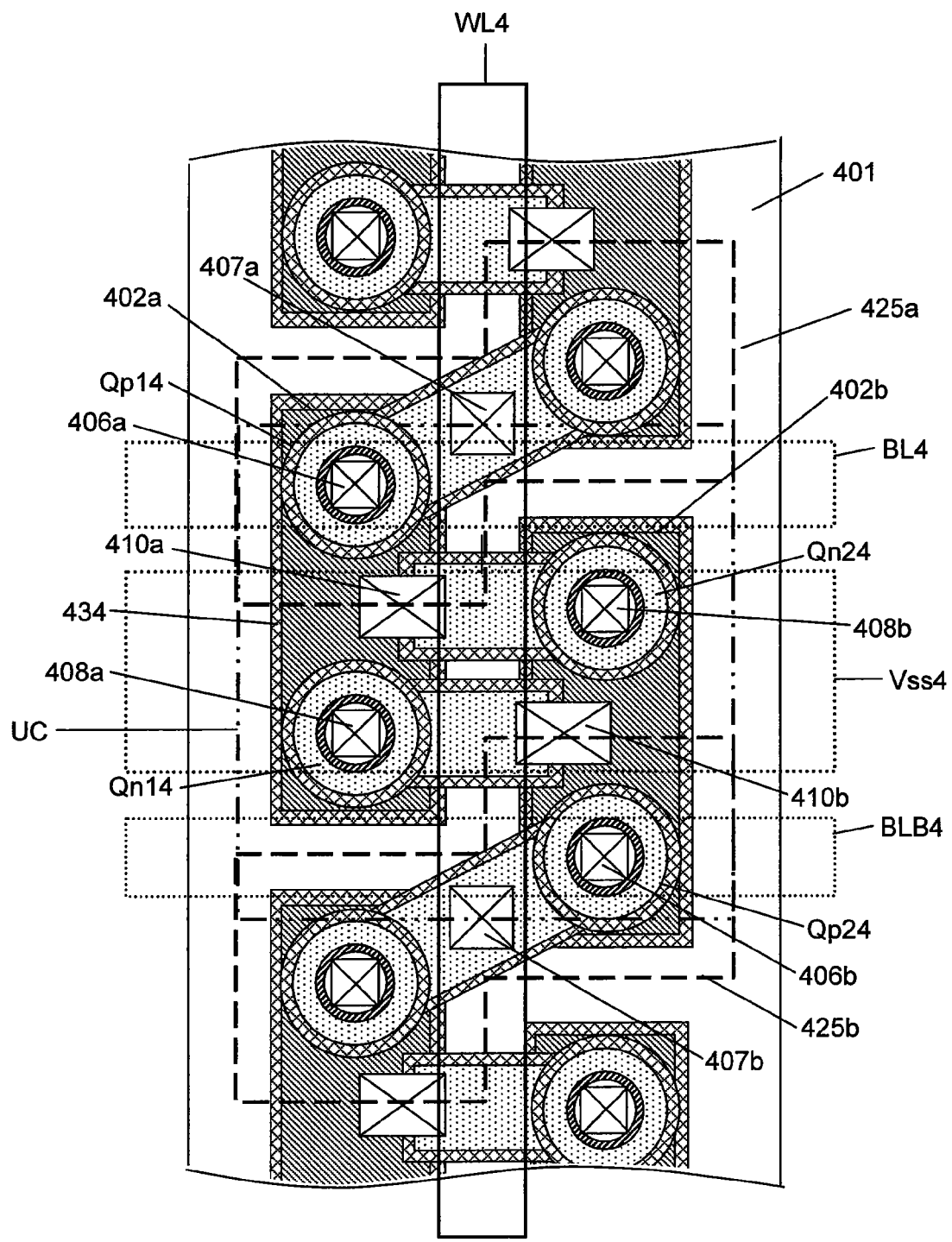
FIG. 22 is a top plan view showing a memory cell of an SRAM according to a fourth embodiment of the present invention.

FIG. 22 illustrates a layout of a memory cell in an SRAM according to a fourth embodiment of the present invention. The fourth embodiment is different from other embodiments in that pillar-shaped silicon layers are arrayed in a hexagonal lattice pattern to have a close-packed arrangement. In the fourth embodiment, the pillar-shaped silicon layers can be arranged in the smallest area in a balanced manner, so that the SRAM can be designed to have a sufficiently-small cell area. The arrangement of transistors is not limited to the hexagonal lattice pattern illustrated in FIG. 22, but any other suitable close-packed arrangement may be employed.

As mentioned in the first embodiment, in order to share each of the word line, the bit line and the ground potential line, with other memory cells, such a line is preferably laid out in a higher-level layer than a node interconnection line to be wired in each of the memory cells. As one example of the hierarchical wiring configuration, it is contemplated that a word line WL4 is wired in a mid-level layer, and each of a bit line (BL4, BLB4) and a ground potential line Vss4a is wired in a higher-level layer, to keep each line from coming in contact with an unintended one of the contacts.

Fifth Embodiment

Figure 23:
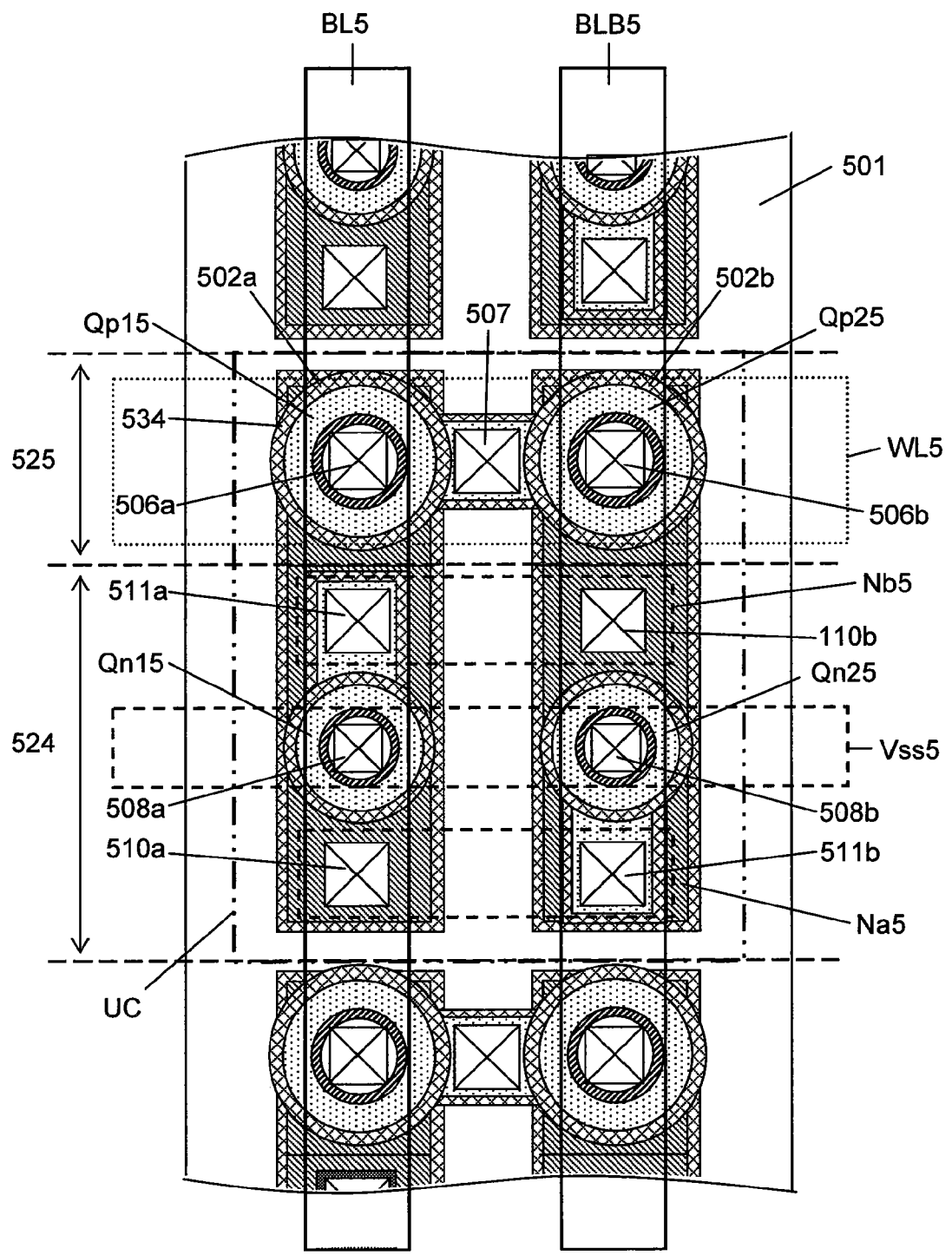
FIG. 23 is a top plan view showing a memory cell of an SRAM according to a fifth embodiment of the present invention.
Figure 24:
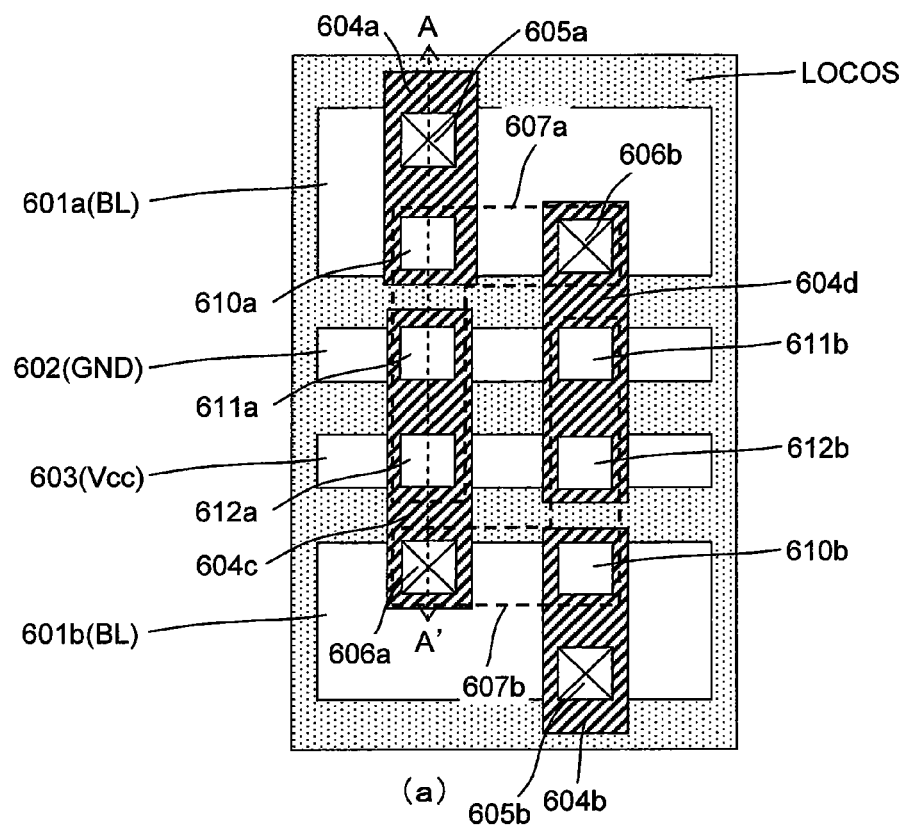
FIGS. 24(a) and 24(b) are, respectively, a top plan view and a sectional view showing a memory cell of a conventional SRAM.
Figure 24:
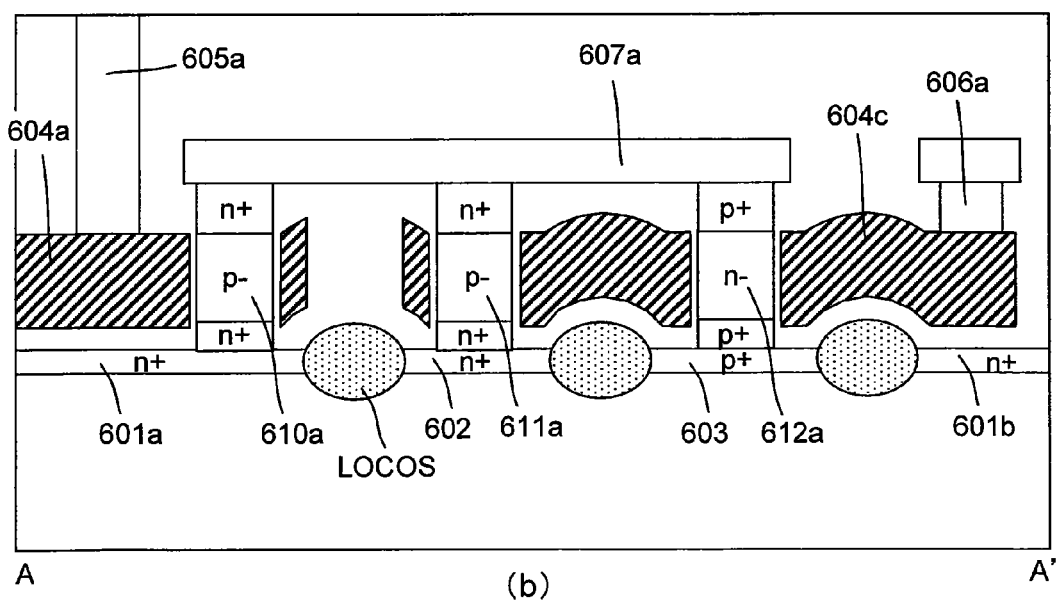

FIG. 23 illustrates a layout of a memory cell in an SRAM according to a fifth embodiment of the present invention. The fifth embodiment is different from the first embodiments in terms of a shape of a pillar-shaped silicon layer constituting an access transistor, and a size of a pillar-shaped silicon layer constituting a driver transistor. In the Loadless 4T-SRAM of the present invention, it is necessary to set a leak current of an access transistor to be greater than that of a driver transistor. In order to increase the leak current of the access transistor, a technique of reducing a threshold voltage may be employed. Alternatively, as shown in FIG. 23, a pillar-shaped silicon layer constituting the access transistor may be formed in a larger size to slightly increase short-channel effects in the access transistor so as to increase a leak current. In this case, a drain current of the access transistor is increased with respect to that of the driver transistor, so that a writing margin can also be improved.

In cases where there is a need for improving a reading margin, a peripheral length of a pillar-shaped silicon layer of the driver transistor may be increased to increase the drain current of the driver transistor with respect to that of the access transistor so as to improve the reading margin.

Although the peripheral length of the pillar-shaped silicon layer can be increased to increase the drain current, the short-channel effects become prominent. Thus, the shape of the pillar-shaped silicon layer has to be designed while taking into account trade-off therebetween. The pillar-shaped silicon layer may be formed in an oval shape or a rectangular shape to increase the peripheral length thereof while suppressing the short-channel effects.

As above, respective shapes of the access and driver transistors can be changed to adjust various ARAM characteristics.

As mentioned in the first embodiment, in order to share each of the word line, the bit line, the power supply potential line and the ground potential line, with other memory cells, such a line is preferably laid out in a higher-level layer than a node interconnection line to be wired in each of the memory cells. As one example of the hierarchical wiring configuration, the same configuration as that in the first embodiment may be employed.

The remaining structure is the same as that in the first embodiment, and its description will be omitted.

As described above, according to the present invention, in a static type memory made up using four MOS transistors, each of the MOS transistors is formed as an SGT where a drain, a gate and a source are arranged in a vertical direction, and an SOI substrate is used to allow an element isolation region with a narrow isolation width to be easily formed. Further, an N⁺ drain diffusion layer and a P⁺ drain diffusion layer each formed in a planar silicon layer on a buried oxide film are directly connected to each other through a silicide layer. This makes it possible to achieve a Loadless 4-T SRAM with an extremely small memory cell area.

What is claimed is:

1. A semiconductor storage device comprising a static type memory cell in which four MOS transistors are arrayed on a dielectric film formed on a substrate, wherein:
   the four MOS transistors function as first and second PMOS access transistors each operable to supply electric charges to hold data in the memory cell, and allow access to the memory cell, and first and second PMOS driver transistors each operable to drive a storage node to write and read data in the memory cell, and further wherein:
   the first and second NMOS access transistors comprise a first diffusion layer of P-type conduction, a first pillar-shaped semiconductor layer and a second diffusion layer of P-type conduction arranged on a dielectric film formed on the substrate, hierarchically in a vertical direction; the first pillar-shaped semiconductor layer is arranged between the first diffusion layer formed on the bottom of the first pillar-shaped semiconductor layer and the second diffusion layer formed on the top of the first pillar-shaped semiconductor layer; and a gate is formed along a sidewall of the first pillar-shaped semiconductor layer;
   the first and second NMOS driver transistors comprise a third diffusion layer of N-type conduction, a second pillar-shaped semiconductor layer and a fourth diffusion layer of N-type conduction arranged on the dielectric film formed on the substrate, hierarchically in a vertical direction; the second pillar-shaped semiconductor layer is arranged between the third diffusion layer formed on the bottom of the second pillar-shaped semiconductor layer and the fourth diffusion layer formed on the top of the second pillar-shaped semiconductor layer; and a gate is formed along a sidewall of the second pillar-shaped semiconductor layer;
   the first PMOS access transistor and the first NMOS driver transistor are arrayed in adjacent relation to each other;
   the second PMOS access transistor and the second NMOS driver transistor are arrayed in adjacent relation to each other;
   the first diffusion layer of P-type conduction formed on the bottom of the first PMOS access transistor and the third diffusion layer of N-type conduction formed on the bottom of the first NMOS driver transistor, are arranged on the dielectric film to serve as a first storage node for holding data therein, wherein the first diffusion layer and the third diffusion layer serving as the first storage node are connected to each other through a first silicide layer formed on respective surfaces of the first and third diffusion layers serving as the first storage node; and
   the first diffusion layer of P-type conduction formed on the bottom of the second PMOS access transistor and the third diffusion layer of N-type conduction formed on the bottom of the second NMOS driver transistor, are arranged on the dielectric film to serve as a second storage node for holding data therein, wherein the first diffusion layer and the third diffusion layer serving as the second storage node are connected to each other through a second silicide layer formed on respective surfaces of the first and third diffusion layers serving as the second storage node.

2. The semiconductor storage device as defined in claim 1, wherein at least one of first and second contacts to be formed on first and second gate lines extending from respective gate electrodes of the first and second PMOS access transistors is shared as a contact to be formed on a gate line extending from a gate electrode of a PMOS access transistor in an adjacent memory cell.

3. The semiconductor storage device as defined in claim 1, wherein the pillar-shaped semiconductor layers are arrayed in a hexagonal lattice pattern.

4. The semiconductor storage device as defined in claim 1, wherein:
   a third gate line extending from the gate of the first NMOS driver transistor formed on one of the first diffusion layers serving as the first storage node is connected to one of the second diffusion layers serving as the second storage node, through a common third contact; and
   a fourth gate line extending from the gate of the second NMOS driver transistor formed on one of the second diffusion layers serving as the second storage node is connected to one of the first diffusion layers serving as the first storage node, through a common fourth contact.

5. The semiconductor storage device as defined in claim 1, wherein a peripheral length of the sidewall in each of the pillar-shaped semiconductor layers forming the first and second NMOS driver transistors is the same as or longer than a peripheral length of the sidewall in each of the pillar-shaped semiconductor layers forming the first and second PMOS access transistors.

6. The semiconductor storage device as defined in claim 1, wherein the four MOS transistors are arranged on the dielectric film in a two-row by two-column array, and further wherein:
- the first PMOS access transistor is arranged at an intersection of the 1st row and the 1st column;
- the first NMOS driver transistor is arranged at an intersection of the 2nd row and the 1st column;
- the second PMOS access transistor is arranged at an intersection of the 1st row and the 2nd column; and
- the second NMOS driver transistor is arranged at an intersection of the 2nd row and the 2nd column.

7. The semiconductor storage device as defined in claim 6, wherein:
- a fifth gate line extending from the respective gates of the first and second PMOS access transistors is connected to a common fifth contact.

8. The semiconductor storage device as defined in claim 1, wherein the four MOS transistors are arranged on the dielectric film in a two-row by two-column array, and further wherein:
- the first PMOS access transistor is arranged at an intersection of the 1st row and the 1st column;
- the first NMOS driver transistor is arranged at an intersection of the 2nd row and the 1st column;
- the second PMOS access transistor is arranged at an intersection of the 2nd row and the 2nd column; and
- the second NMOS driver transistor is arranged at an intersection of the 1st row and the 2nd column.

* * * * *